(12) United States Patent
Motomochi et al.

(10) Patent No.: US 7,330,379 B2
(45) Date of Patent: Feb. 12, 2008

(54) SEMICONDUCTOR MEMORY DEVICE HAVING FORCED FAIL FUNCTION OF FORCING A MEMORY CELL AT A SPECIFIC ADDRESS TO FAIL AND METHOD FOR TESTING SAME

(75) Inventors: Kenji Motomochi, Suita (JP); Marefusa Kurumada, Mukou (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 86 days.

(21) Appl. No.: 11/229,771

(22) Filed: Sep. 20, 2005

(65) Prior Publication Data
US 2006/0067135 A1    Mar. 30, 2006

(30) Foreign Application Priority Data
Sep. 27, 2004    (JP)    ............................. 2004-279343

(51) Int. Cl.
*G11C 7/00*    (2006.01)
(52) U.S. Cl. .............................. 365/189.05; 365/230.08
(58) Field of Classification Search ........... 365/189.01, 365/189.05 O, 230.01, 230.06, 230.08 X, 365/189.05, 230.08; 711/202, 203, 205, 711/206; 714/710, 711, 723
See application file for complete search history.

(56) References Cited

U.S. PATENT DOCUMENTS 5,317,573 A * 5/1994 Bula et al. .................. 714/711
5,559,741 A    9/1996 Sobue
6,721,935 B2    4/2004 Morinaga

FOREIGN PATENT DOCUMENTS

| JP | 2002269996 | 9/2002 |
| JP | 2002305223 | 10/2002 |

\* cited by examiner

*Primary Examiner*—VanThu Nguyen
(74) *Attorney, Agent, or Firm*—Stevens, Davis, Miller & Mosher, LLP

(57) ABSTRACT

A semiconductor memory device is provided which has a unit by which a fail bit map can be checked instantaneously over the entire address space. The semiconductor memory device is provided with a data logic forcefully controlling circuit 21 which forcefully controls the logic of write data into memory cells selected by using a specified address signal or of read data, a specified row forcefully controlling circuit 40 which forcefully makes the control of memory cells selected according to specified row addresses the control exercised during operation different from normal operation, or a specified column forcefully controlling circuit 50 which forcefully makes the control of memory cells selected according to specified column addresses the control exercised during operation different from normal operation. This forced fail operation mode is selectable aside from normal operation mode.

32 Claims, 29 Drawing Sheets

SEMICONDUCTOR MEMORY DEVICE HAVING FORCED FAIL FUNCTION OF FORCING A MEMORY CELL AT A SPECIFIC ADDRESS TO FAIL AND METHOD FOR TESTING SAME

BACKGROUND OF THE INVENTION

1. Field of the Invention

The present invention relates to a semiconductor memory device having the forced fail function of forcing a memory cell at a specified address to fail when the memory cell is accessed and to a method for testing the same.

2. Background Art

With the progression of the technology of implementing finer design rules, the development of large-capacity general-purpose semiconductor memory devices having a gigabit-level memory space and high-functionality system LSIs having a large-capacity memory macro is being pursued at a feverish space at present. In light of such a situation, a technique of producing a fail bit map, which visually shows a case where failure occurs in memory cells accessed at the time of an analysis of these semiconductor memory devices, is thought to be very important.

The technique of producing the fail bit map will be described below.

Generally, a plurality of memory cells are arranged in matrix form in a memory space on a semiconductor memory device and each memory cell is given an address represented by a row address and a column address. The fail bit map is produced based on fail address information outputted from test equipment at the time of a test on a semiconductor memory device and visually indicates the location of the fail memory cells by reproducing the matrix arrangement of the memory cells on the actual semiconductor memory device on the screen of the test equipment or by printing out such an arrangement.

To obtain the fail bit map, as a matter of course, there is a necessity to prepare a fail bit map program in advance. That is, there is a necessity to grasp the tendency of address information outputted from test equipment and the position of the memory cells given by the address information from test programs, circuit configurations, layout configurations, and so on and to store the tendency in the form of a program. With a method for checking the correctness of a fail bit map program produced and of a fail bit map obtained, the reliability of the fail bit map has been ensured by checking that the positions of failure bits are indicated correctly on the fail bit map after the intentional production of the failure bits through the working of specified memory cells on a real chip using FIB (focus ion beam) or the like.

A conventional method for checking a fail bit map will be described with reference to FIGS. 28 and 29. FIG. 28 is an explanatory drawing of part of a memory macro placed on an actual semiconductor memory device. In FIG. 28, reference numeral 11A denotes part of a memory array, reference numeral 12A denotes part of a row decoder, and reference numeral 13A denotes part of a column decoder. In the part 11A of the memory array, a plurality of memory cells having addresses are arranged in matrix form. The memory cell at the circled address of "0A" is the memory cell which has been worked intentionally by the method of FIB or the like to make a failure bit used for the checking of a fail bit map. The location of the memory cell at the address of "0A" in the part 11A of the memory array is represented by a column address of "2" and a row address of "1". The physical order of the memory cell is represented by the third column from the left and the second row from the bottom. A test on the semiconductor memory device confirms that there has been no failure bit before the memory cell at the address of "0A" is intentionally worked for the purpose of producing the failure bit.

FIG. 29 is a fail bit map of the semiconductor memory device shown in FIG. 28. This fail bit map is represented as a matrix with 8 rows and 8 columns and reproduces the arrangement of the memory array on the real semiconductor memory device. Addresses of "0" to "7" are provided in both row and column directions and it is shown that a memory cell at solidly shaded position is defective. In this case, the memory cell at the position represented by the column address of "2" and the row address of "1" is shaded solidly; therefore, this position corresponds to that of the memory cell intentionally worked on the real semiconductor memory device to produce the failure bit.

Up to now, the reliability of the fail bit map has been ensured by using such a method.

Techniques related to the production of the fail bit map are disclosed in JP-A Nos. 2002-269996 and 2002-305223.

However, in such conventional methods for checking the fail bit maps, additional working such as FIB is required, much time is taken, and checkable address areas are limited, so that the checking of the correct indication of the entire address spaces has not been done actually.

SUMMARY OF THE INVENTION

An object of the present invention is to provide a semiconductor memory device, whose fail bit map over its entire address space can be checked instantaneously without a need for working such as intentionally making failure bits by means of FIB, and a method for testing the semiconductor memory device.

The semiconductor memory device according to the invention includes a memory cell array composed of a plurality of memory cells whose addresses are represented by a plurality of row addresses and a plurality of column addresses, a row selecting unit which selects the memory cells at the specified rows from among the memory cells, a column selecting unit which selects the memory cells at the specified columns from among the memory cells, a data writing unit which writes data into the specified memory cells selected by the row selecting unit and the column selecting unit, a data reading unit which reads the data from the specified memory cells, and a data logic forcefully controlling unit. The data logic forcefully controlling unit forcefully controls the logic of the write data into the memory cells selected by using a specified address signal or of the read data.

According to such a configuration, since the data logic forcefully controlling unit, which forcefully controls the logic of the write data into the memory cells selected by using the specified address signal or of the read data, is provided, it is possible to force the specified memory cells to fail when accessed without the physical working of the cells.

According to the invention, since the fail bit map can be checked instantaneously over the entire address space without the need for the working such as intentionally making the failure bits by means of FIB, it is possible to substantially reduce man-hours needed to check the fail bit map and to ensure the reliability of the fail bit map.

Another semiconductor memory device according to the invention includes a memory cell array composed of a plurality of memory cells whose address are represented by a plurality of row addresses and a plurality of column addresses, a row selecting unit which select the memory cells at the specified rows from among the memory cells, a column selecting unit which selects the memory cells at the specified columns from among the memory cells, a data writing unit which writes data into the specified memory cells selected by the row selecting unit and the column selecting unit, a data reading unit which reads the data from the specified memory cells, and a specified row forcefully controlling unit. The specified row forcefully controlling unit forcefully makes the control of the memory cells selected by using a specified row address signal the control exercised during operation different from normal operation.

According to such a configuration, since the control of the memory cells selected by using the specified row address signal can be changed forcefully to the control exercised during operation different from normal operation by using the specified row forcefully controlling unit, the memory cells at the specified rows can be forced to fail when accessed without the physical working of a row-specified memory cell activating unit.

Another semiconductor memory device according to the invention includes a memory cell array composed of a plurality of memory cells whose addresses are represented by a plurality of row addresses and a plurality of column addresses, a row selecting unit which selects the memory cells at the specified rows from among the memory cells, a column selecting unit which selects the memory cells at the specified columns from among the memory cells, a data writing unit which writes data into the specified memory cells selected by the row selecting unit and the column selecting unit, a data reading unit which reads the data from the specified memory cells, and a specified column forcefully controlling unit. The specified column forcefully controlling unit forcefully makes the control of the memory cells selected by using a specified column address signal the control exercised during operation different from normal operation.

According to such a configuration, since the control of the memory cells selected by using the specified column address signal can be changed forcefully to the control exercised during operation different from normal operation by using the specified column forcefully controlling unit, the memory cells at the specified columns can be forced to fail when accessed without the physical working of a column-specified memory cell activating unit.

Another semiconductor memory device according to the invention includes a memory macro and a data logic controlling unit. The memory macro has a memory cell array composed of a plurality of memory cells whose addresses are represented by a plurality of row addresses and a plurality of column addresses, a row selecting unit which selects the memory cells at the specified rows from among the memory cells, a column selecting unit which selects the memory cells at the specified columns from among the memory cells, a data writing unit which writes data into the specified memory cells selected by the row selecting unit and the column selecting unit, and a data reading unit which reads the data from the specified memory cells. The data logic controlling unit forcefully controls the logic of the data written into the memory cells selected by using a specified address signal or of the data read therefrom. The memory macro and the data logic controlling unit are hard IP macros having independent functions which are available individually.

According to such a configuration, the memory macro, which has the various components required for normal operation, and the data logic forcefully controlling unit, which forcefully controls the logic of the data written into the memory cells selected by using the specified address signal or of the data read therefrom, are provided. The memory macro and the data logic forcefully controlling unit are each the hard IP macro having the independent function and are provided (supplied) individually.

Therefore, since the memory macro and the data logic forcefully controlling unit are each the hard IP macro having the independent function, the memory cells at the specified addresses can be forced to fail by simply adding the novel data logic forcefully controlling unit to an existing memory macro. In addition, since the data logic forcefully controlling unit can be placed independently from the semiconductor memory device including the memory macro, the memory cells at the specified addresses can be forced to fail by placing the data logic forcefully controlling unit between the semiconductor memory device and the semiconductor memory testing device.

In such a configuration, the data logic forcefully controlling unit is included in a data input and output buffer cell block.

According to the configuration, since data logic forcefully controlling unit is included in the data input and output buffer cell block of the semiconductor memory device, the memory cells at the specified addresses can be forced to fail by simply placing the data input and output buffer cell block without particular consideration of the placement of the data logic forcefully controlling unit.

A method for testing a semiconductor memory device according to the invention is a method for testing the semiconductor or memory device according to claim 1 including the data logic forcefully controlling unit. This unit, which forcefully controls the logic of data written into the memory cells selected by using a specified address signal or of the data read therefrom, is a soft IP having an independent function, controls various signals between the semiconductor memory device and a semiconductor memory testing device, and is controlled by the signals.

Therefore, by using the data logic forcefully controlling unit, which is soft IP having the independent function, controls the various signals between the semiconductor memory device and the semiconductor memory testing device, and is controlled by the signals, the memory cells at the specified addresses can be forced to fail without the placement of the data logic forcefully controlling unit onto the semiconductor memory device and the particular modification of a test program for regular testing.

In such a configuration, the forcefully controlling unit is included in a memory macro which includes components required for normal operation.

According to the configuration, since the forcefully controlling unit is included in the memory macro which includes the components required for normal operation, the memory cells at the specified addresses can be forced to fail by simply placing the memory macro without the particular consideration of the placement of the forcefully controlling unit.

In such a configuration, an address scramble circuit is provided which converts a logical address signal inputted from the outside to a physical address signal inputted to various internal circuits which include a row selecting unit and a column selecting unit.

According to the configuration, since the address scramble circuit, which converts the logical address signal inputted from the outside to the physical address signal inputted to the row selection unit or the column selection unit, is provided, it is possible to make the logical addresses inputted from the outside correspond to the addresses of the memory cells.

The data logic forcefully controlling unit included in this configuration reverses the logic of at least 1 specified bit of write or read data.

According to the configuration, since the data logic forcefully controlling unit reverses the logic of at least the 1 specified bit of write or read data, the logic of the write and read data is reversed, which makes it possible to force the memory cells at the specified addresses to fail.

The data logic forcefully controlling unit included in the configuration forcefully fixes the logic of at least the 1 specified bit of write or read data to a "L" or "H" state.

According to the configuration, since the data logic forcefully controlling unit forcefully fixes the logic of at least the 1 specified fit of write or read data to the "L" or "H" state, the memory cells at the specified addresses can be forced to fail by writing of reading logical data whose logic is opposite to the logic fixed forcefully.

A specified row forcefully controlling unit included in this configuration deactivates word lines selected according to specified row addresses.

According to the configuration, since the specified row forcefully controlling unit deactivates the word lines selected according to the specified row addresses, it is possible to force the memory cells at the specified row addresses to fail.

A specified column forcefully controlling unit included in this configuration deactivates a bit line selecting switch selected according to specified column addresses.

According to the configuration, since the specified column forcefully controlling unit deactivates the bit line connecting switch selected according to the specified column addresses, it is possible to force the memory cells at the specified column addresses to fail.

The specified column forcefully controlling unit included in the configuration deactivates sense amplifiers selected according to the specified column addresses.

According to the configuration, since the specified column forcefully controlling unit deactivates the sense amplifiers selected according to the specified column addresses, it is possible to force the memory cells at the specified column addresses selected to the sense amplifiers to fail.

The specified column forcefully controlling unit included in the configuration deactivates specified data input and output ports.

According to the configuration, since the specified column forcefully controlling unit deactivate the specified data input and output ports, it is possible to force all the memory cells corresponding to the specified data input and output ports to fail.

The forcefully controlling units included in the configuration are controlled through the medium of operation mode terminals specifically provided to set the semiconductor memory device.

According to the configuration, since the data logic forcefully controlling unit, the specified row forcefully controlling unit, or the specified column forcefully controlling unit is controlled through the medium of the operation mode terminals specifically provided to set the semiconductor memory device, it is possible to force the memory cells at the specified addresses to fail without the modification of the functions or requirements of a plurality of control terminals used in normal operation mode.

The forcefully controlling units included in the configuration are controlled through the medium of the control terminals of the semiconductor memory device used in normal operation mode.

According to the configuration, since the data logic forcefully controlling unit, the specified row forcefully controlling unit, or the specified column forcefully controlling unit are controlled through the medium of the control terminals of the semiconductor memory device used in normal operation mode, it is possible to force the memory cells at the specified addresses to fail without the provision of a special terminal for operation mode setting.

The forcefully controlling units included in the configuration are controlled by using address signals.

According to the configuration, since the data logic forcefully controlling unit, the specified row forcefully controlling unit, or the specified column forcefully controlling unit is controlled by using the address signal, it is possible to force the memory cells at the specified addresses to fail only when the specified addresses have been inputted by detecting the address signal.

The data logic forcefully controlling circuit included in the configuration detects the complete correspondence of the column address signal and the row address signal to control the logic of the write or read data.

According to the configuration, since the data logic forcefully controlling unit detects the complete correspondence of the column address signal and the row address signal to control the logic of the write or read data, only the memory cells positioned on a diagonal line of the memory cells arranged in matrix form can be forced to fail.

The data logic forcefully controlling unit included in the configuration detects the partial correspondence of the column address signal and the row address signal to control the logic of the write or read data.

According to the configuration, since the data logic forcefully controlling unit detects the partial correspondence of the column address signal and the row address signal to control the logic of the write or read data, only the memory cells positioned on a specified oblique line of the memory cells arranged in matrix form can be forced to fail.

The data logic forcefully controlling unit included in the configuration detects part of the row address signal to select the data input and output ports which control the logic of the write or read data.

According to the configuration, since the data logic forcefully controlling unit detects the part of the row address signal to select the data input and output ports which control the logic of the write and read data, it becomes possible to distinguish between the memory cells whose row address and column address are the same according to a difference between the data input and output ports, so that the memory cells at the specified addresses in the specified data input and output ports can be forced to fail.

The forcefully controlling units included in the configuration have forced fail units which force the memory cells whose addresses are represented by all the rows and the specific columns to fail and which force the memory cells whose addresses are represented by all the columns and the specific rows to fail.

According to the configuration, since the forced fail units, which force the memory cells whose addresses are represented by all the rows and the specific columns to fail and which force the memory cells whose addresses are represented by all the columns and the specific rows to fail, are provided, it is possible to accomplish the checking of address mapping and data input and output port mapping over the entire memory space.

The forcefully controlling units included in the configuration have the forced fail units which form fail bit patterns characteristic of the placement directions of the memory macro including the memory cells.

According to the configuration, since the forced fail units, which form the fail bit patterns characteristics of the placement directions of the memory macro including the memory cells, are provided, it is possible to check the placement direction of the memory macro.

The forcefully controlling units included in the configuration have forced fail units which form fail bit patterns with which the address mapping and the data input and output port mapping can be checked over the entire memory space even when the memory cells arranged in the row direction differ from those arranged in the column direction in number.

According to the configuration, since the forced fail unit, which forms the fail bit pattern with which the address mapping and the data input and output port mapping can be checked over the entire memory space even when the memory cells arranged in the row direction differ from those arranged in the column direction in number, is provided, it is possible to check the address mapping, the data input and output port mapping, and the placement direction of the memory macro even when the memory macro takes on any numeric values on the ratio of the number of the memory cells arranged in the row direction to that of the memory cells arranged in the column direction.

DESCRIPTION OF THE EXEMPLARY EMBODIMENTS

Embodiments of the present invention will be described below with reference to the drawings.

Figure 1:
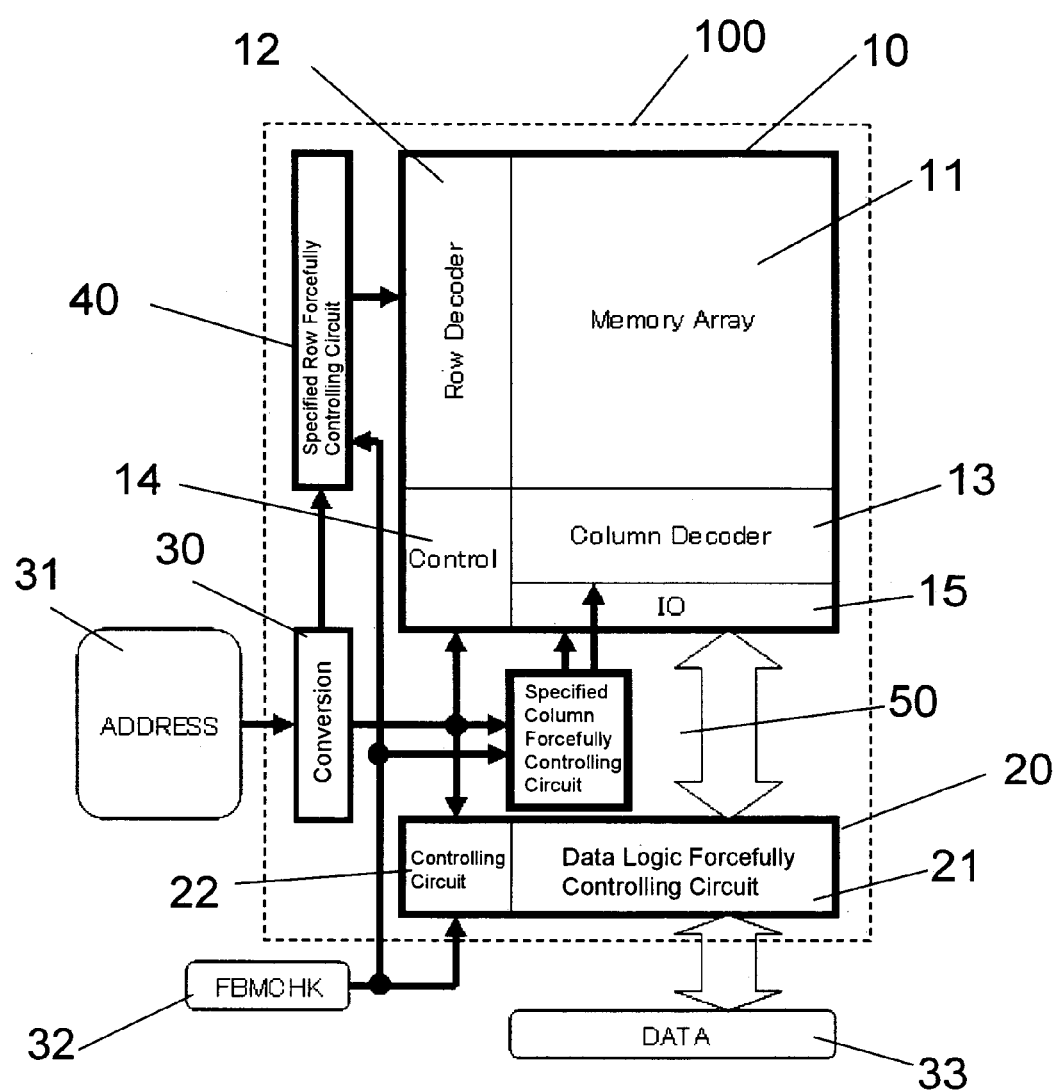
FIG. 1 is a block diagram showing an example of a configuration of a semiconductor memory device according to a first embodiment of the present invention.

FIG. 1 is a block diagram showing an example of a configuration of a semiconductor memory device according to a first embodiment of the invention. A semiconductor memory device 100 shown in FIG. 1 has a memory macro 10, a data logic forcefully controlling block 20, an address scramble block 30, a specified row forcefully controlling block 40, and a specified column forcefully controlling circuit 50. The memory macro 10 is composed of a memory array 11, a row decoder 12, a column decoder 13, a control unit 14, and a data input and output circuit 15. The data logic forcefully controlling block 20 is composed of a data logic forcefully controlling circuit 21 and the flag signal generation circuit 22 of the data logic forcefully controlling circuit. The semiconductor memory device 100 is a general-purpose semiconductor memory device or a system LS1 including a memory macro and has various other function blocks; however, the explanation of those function blocks is omitted. In addition, the memory macro 10 and the data logic forcefully controlling block 20 are each a hard IP macro having an independent function and can be provided or supplied individually.

A plurality of logical address signals 31 inputted from the outside of the semiconductor memory device 100 to the address scramble block 30 are converted to physical address signals and then inputted to the control unit 14 of the memory macro 10, the flag signal generation circuit 22 of the data logic forcefully controlling circuit included in the data logic forcefully controlling block 20, the specified row forcefully controlling circuit 40, and the specified column forcefully controlling circuit 50. Furthermore, the address scramble block 30 serves the function of converting the logical address signals 31 inputted from the outside to the physical address signals inputted to the internal control circuits such as the row selection unit and the column selection unit; however, there may be cases where no address scramble block 30 is required depending on the circuit configuration and layout configuration of the memory macro 10. FBMCHK signals 32 are inputted from the outside of the semiconductor memory device 100 to the flag signal generation circuit 22 of the data logic forcefully controlling circuit included in the data logic forcefully controlling block 20, the specified row forcefully controlling circuit 40, and the specified column forcefully controlling circuit 50. Input and output data 33 is swapped with the semiconductor memory device 100 via the data logic forcefully controlling circuit 21 of the data logic forcefully controlling block 20. The specified row forcefully controlling circuit 40 controls the row decoder 12 and the specified column forcefully controlling circuit 50 controls the column decoder 13 and the data input and output circuit 15. The FBMCHK signals 32 may be supplied from a special terminal provided to the semiconductor memory device 100 or may be signals generated according to the combinational logic of plural terminals required for its normal operation.

Figure 2:
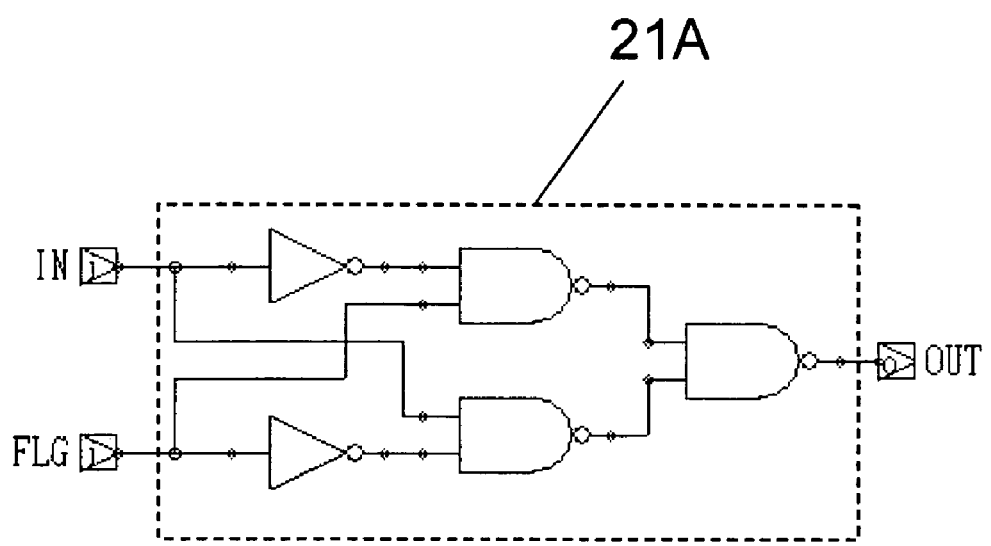
FIG. 2 is a logic circuit diagram of a data inverting circuit unit 21A included in a data logic forcefully controlling circuit 21 shown in FIG. 1.

FIG. 2 is a logic circuit diagram of a data inverting circuit unit 21A which constitutes the data logic forcefully controlling circuit 21 shown in FIG. 1. When the memory macro 10 has a plurality of data input and output ports, the data logic forcefully controlling circuit 21 has as many data inverting circuit units 21A as the data input and output ports. Data signals are inputted to an input terminal IN and are outputted to an output terminal OUT. An input terminal FLG handles flag signals which control the logic of output data.

Figure 3:
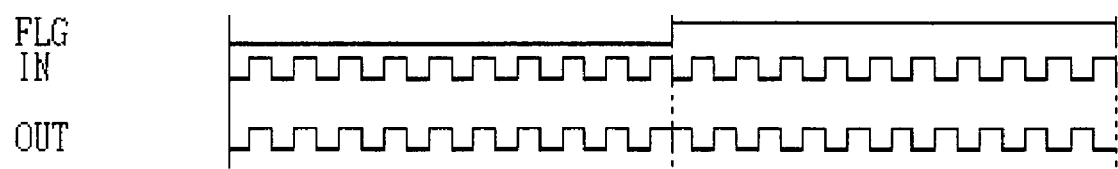
FIG. 3 is a logic chart of the data inverting circuit unit 21A shown in FIG. 2.

FIG. 3 is a logic chart of the data inverting circuit unit 21A shown in FIG. 2. According to FIG. 3, it has been shown that when the flag signal FLG is "low (L)", data inputted to the input terminal IN and data outputted to the output terminal OUT have the same logic, but when the flag signal FLG is "high (H)", the data inputted to the input terminal IN and the data outputted to the output terminal OUT have an inverted logic to each other. Thus, the logic of write or read data can be inverted by using the data logic forcefully controlling circuit 21 constituted by the data inverting circuit unit 21A, by which memory cells at specified addresses can be forced to fail. In addition, to be more simple, the logic of the write or read data may be fixed to a "L" or "H" state when the flag signal rises.

Figure 4:
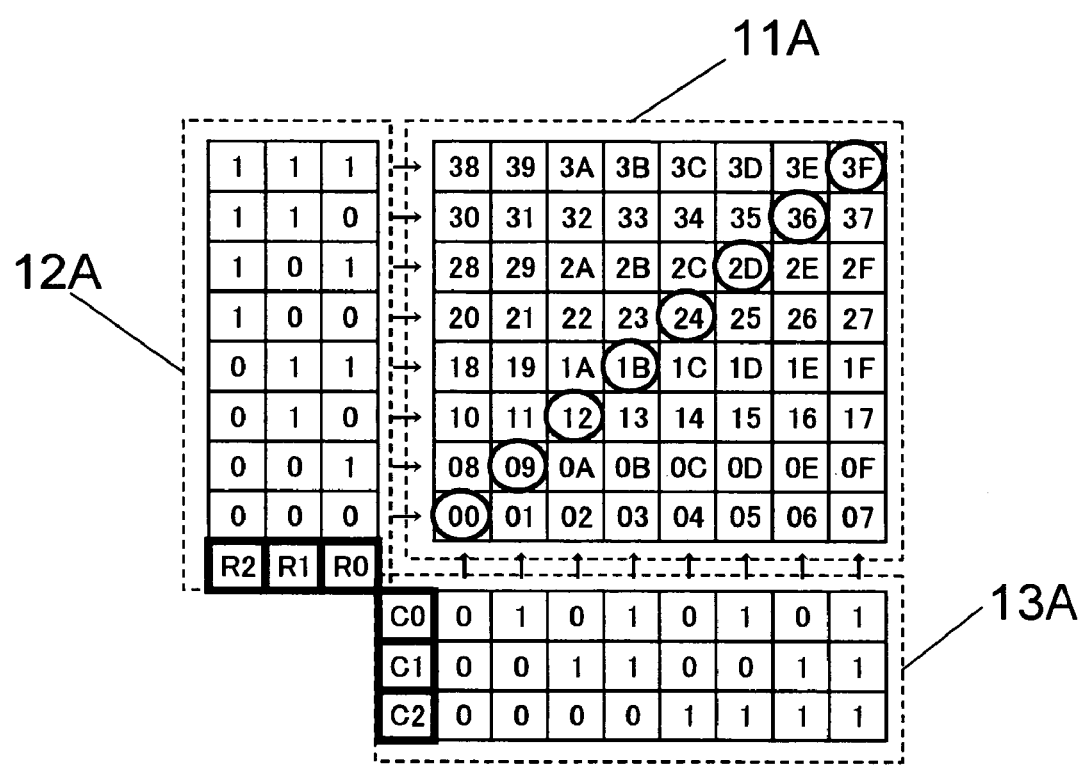
FIG. 4 is a first explanatory drawing of part 11A of a memory array 11, part 12A of a row decoder 12, and part 13A of a column decoder 13 which are included in a memory macro 10 shown in FIG. 1.

FIG. 4 is a first diagram showing part 11A of the memory array 11, part 12A of the row decoder 12, and part 13A of the column decoder 13 which are included in the memory macro 10 shown in FIG. 1. The part of the memory array 11 is made up of 8 rows×8 columns and 64 memory cells are arranged therein. With the part of the row decoder 12, three physical row addresses R0, R1, and R2 are inputted and decoded into eight rows. With the part of the column decoder 13, three physical column addresses C0, C1, C2 are inputted and decoded into 8 columns. The 64 memory cells are each given an address by using the total number of six bits, of which the lower-order three bits mean the physical column address and the higher-order three bits mean the physical row address, and the addresses are indicated in hexadecimal notation. For instance, the address of the memory cell arranged at its lower-left corner is "00" and the address of the memory cell arranged at its upper-right corner is "3F". In FIG. 4, the memory cells positioned on a diagonal line connecting the memory cell having the address of "00" and the memory cell having the address of "3F" are marked with a circle. The memory cells having the circled address are the memory cells having an address where the physical column address represented by the lower-order three bits corresponds completely to the physical row address represented by the higher-order three bits.

Figure 5:
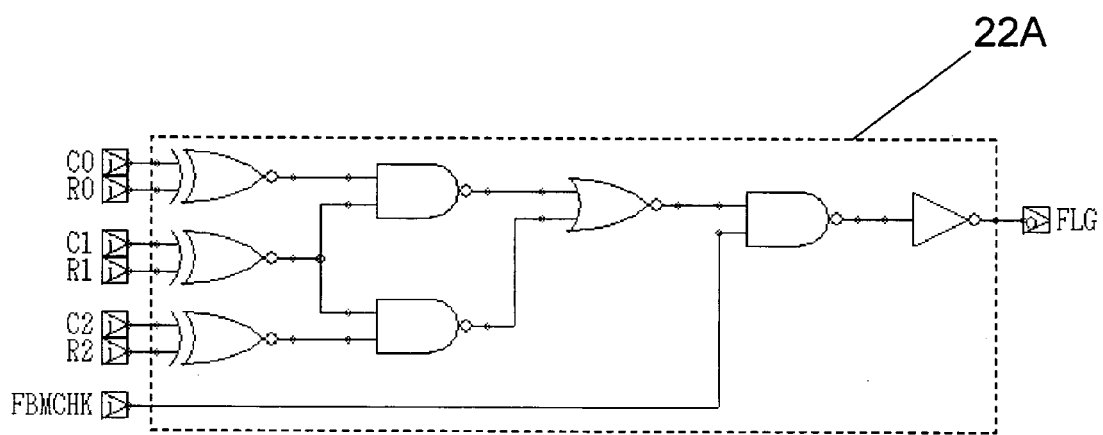
FIG. 5 is a logic circuit diagram of one circuit 22A included in a flag signal generation circuit 22 of the data logic forcefully controlling circuit shown in FIG. 1.

FIG. 5 is a logical circuit diagram of a circuit 22A included in the flag signal generation circuit 22 of the data logic forcefully controlling circuit shown in FIG. 1. The circuit 22A detects the correspondence of the physical row address and the physical column address. When the physical row address corresponds to the physical column address with the FBMCHK signal "H", the flag signal FLG becomes "H". When the FBMCHK signal 32 is "L", the flag signal FLG stays "L".

Figure 6:
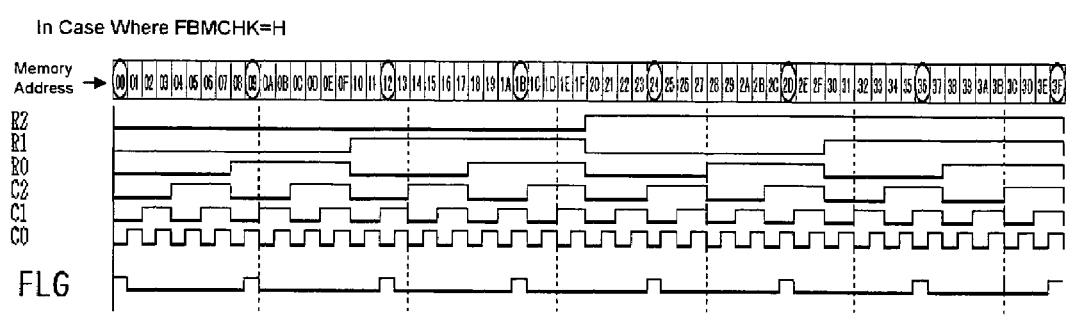
FIG. 6 is a logic chart of the logic circuit shown in FIG. 5.

FIG. 6 is a logic chart of the logical circuit diagram of FIG. 5. In FIG. 6, a case where the FBMCHK signal 32 is "H" is shown and numerals entered in the uppermost section are memory addresses. The circled memory addresses represent the memory addresses where the physical row addresses correspond to the physical column addresses. Symbols R0, R1, and R2 denote the physical row addresses and symbols C0 C1, and C2 denote the physical column addresses. It is apparent from the logic chart that when the circled memory addresses are accesses, that is, when the physical row addresses correspond completely to the physical column addresses, the flag signal FLG becomes "H" and when there is no correspondence between them, the flag signal FLG is "L". Thus it is possible to force only the memory cells positioned on a diagonal line of the memory cells arranged in matrix form to fail through the use of the logical circuit shown in FIG. 5, i.e., the circuit 22A included in the flag signal generation circuit 22 of the data logic forcefully controlling circuit.

Figure 7:
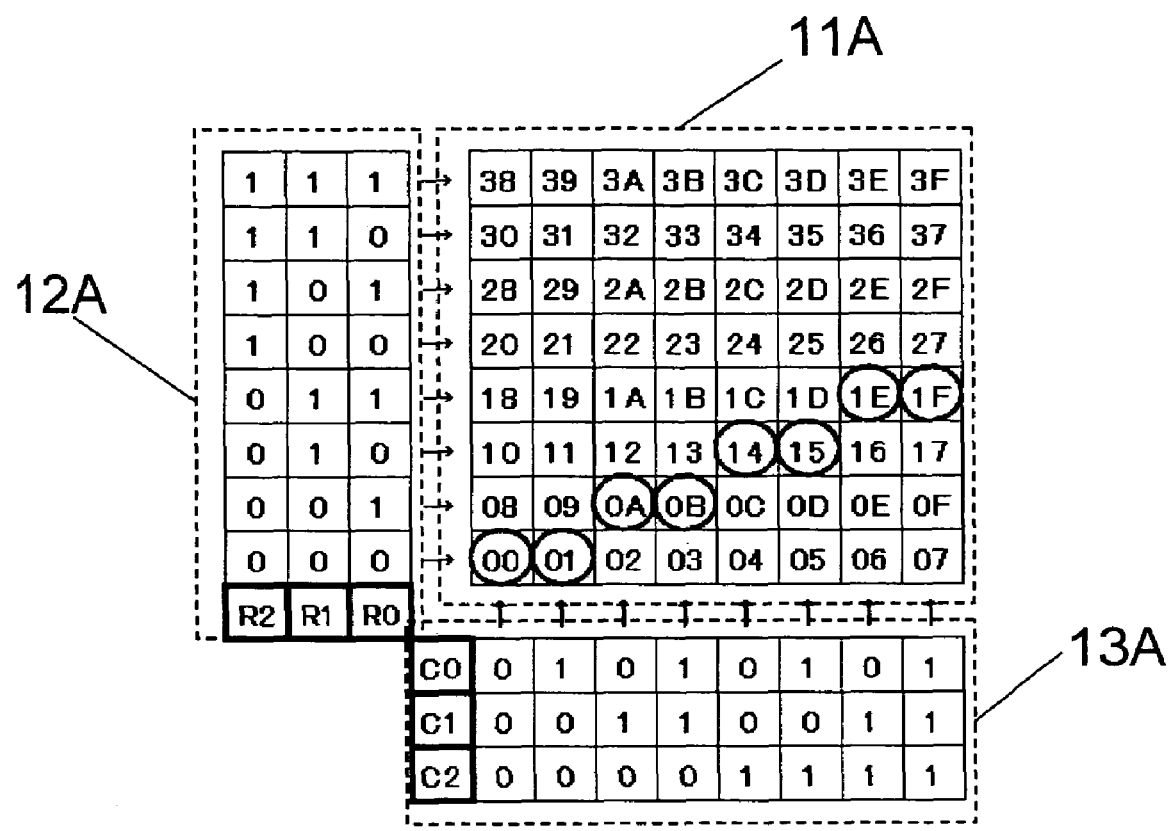
FIG. 7 is a second explanatory drawing of the part 11A of the memory array 11, the part 12A of the row decoder 12, and the part 13A of the column decoder 13 which are included in the memory macro 10 shown in FIG. 1.

Like FIG. 4, FIG. 7 is a second diagram showing the part 11A of the memory array 11, the part 12A of the row decoder 12, and the part 13A of the column decoder 13 which are included in the memory macro 10 shown in FIG. 1. FIG. 7 differs from FIG. 4 in that the addresses of the memory cells marked with the circle are different from those of the memory cells marked with the circle shown in FIG. 4 with the exception of the memory cell having the address of "00". In FIG. 7, the memory cells positioned on a straight line connecting the memory cell at the address of "00" and the memory cell at the address of "1F" are marked with the circle. The memory cells having the circled address are the memory cells whose address is represented by the specified combination of the physical column addresses and the physical row addresses. More specifically, they are the memory cells whose address meets conditions that R2 be 0, R1 correspond with C2, and R0 correspond with C1.

Figure 8:
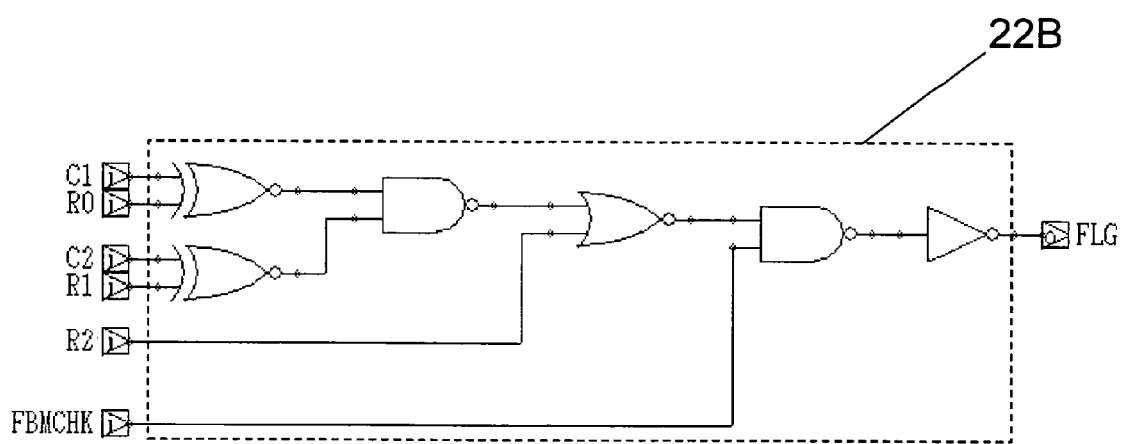
FIG. 8 is a logic circuit diagram of one circuit 22B included in the flag signal generation circuit 22 of the data logic forcefully controlling circuit shown in FIG. 1.

FIG. 8 is a logic circuit diagram of a circuit 22B included in the flag signal generation circuit 22 of the data logic forcefully controlling circuit shown in FIG. 1. When there are specified relationships between the physical row addresses and the physical column addresses with the FBM-CHK signal "H", the flag signal FLG becomes "H". When the FBMCHK signal is "L", the flag signal FLG stays "L".

Figure 9:
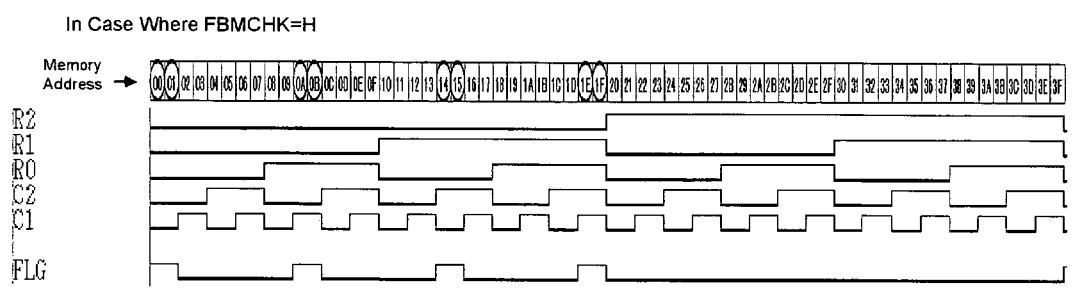
FIG. 9 is a logic chart of the logic circuit shown in FIG. 8.

FIG. 9 is a logic chart of the logic circuit diagram shown in FIG. 8. In FIG. 9, a case where the FBMCHK signal is "H" is shown and numerals entered in the uppermost section are memory addresses. The circled memory addresses represent the memory addresses where there are specified relationships between the physical row addresses and the physical column addresses. Symbols R0, R1, and R2 denote the physical row addresses and symbols C1 and C2 denote the physical column addresses. It is apparent from the logic chart that when the circled memory addresses are accessed, the flag signal FLG becomes "H" and when the memory addresses other than the circled ones are accessed, the flag signal FLG is "L". Thus, only the memory cells positioned on the specified oblique line different from that shown in FIG. 4 of the memory cells arranged in matrix form can be forced to fail by using the logic circuit shown in FIG. 8, i.e., the circuit 22B included in the flag signal generation circuit 22 of the data logic forcefully controlling circuit.

Figure 10:
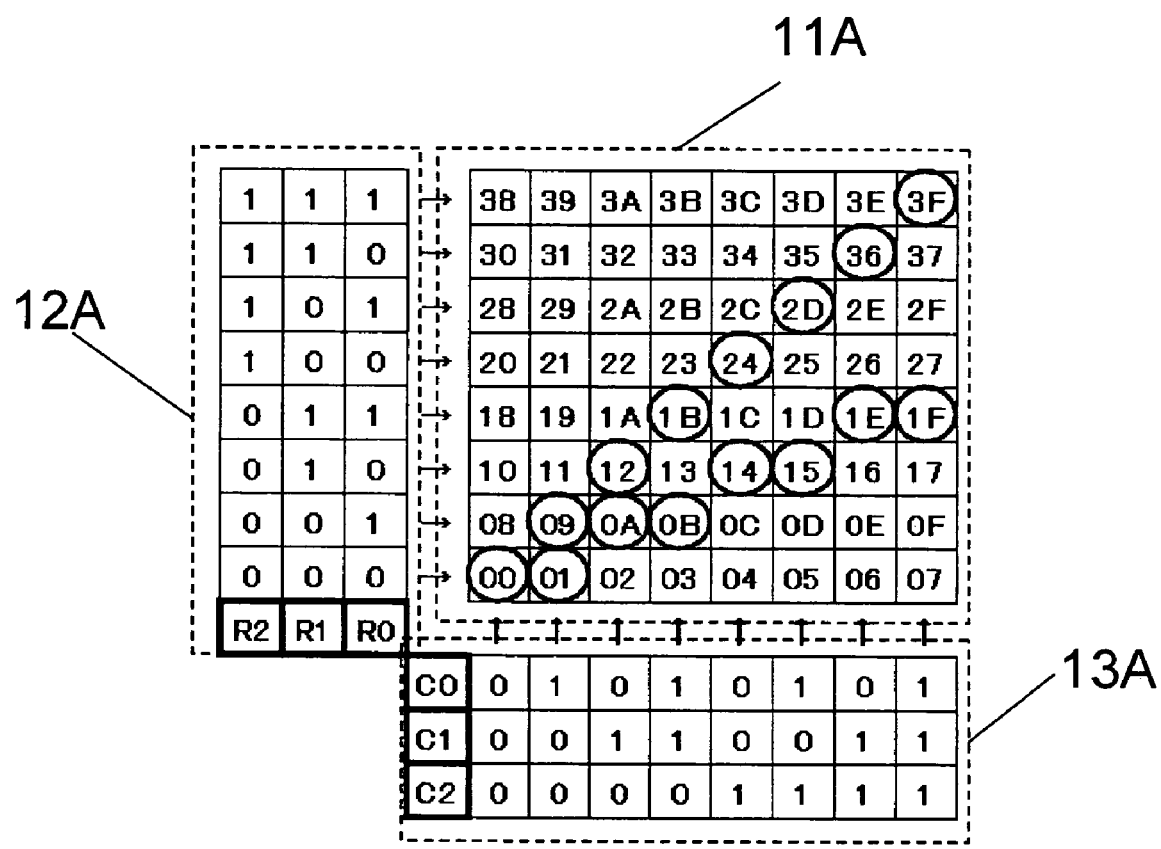
FIG. 10 is a third explanatory drawing of the part 11A of the memory array 11, the part 12A of the row decoder 12, and the part 13A of the column decoder 13 which are included in the memory macro 10 shown in FIG. 1.

Like FIG. 4 or FIG. 7, FIG. 10 is a third diagram showing the part 11A of the memory array 11, the part 12A of the row decoder 12, and the part 13A of the column decoder 13 which are all included in the memory macro 10 shown in FIG. 1. FIG. 10 differs from FIG. 4 or FIG. 7 in that the addresses of the memory cells marked with a circle shown in FIG. 10 correspond to those of the memory cells marked with the circle shown in FIG. 4 and to those of the memory cells marked with the circle shown in FIG. 7. That is, all the memory cells positioned on the diagonal line connecting the memory cell at the address of "00" and the memory cell at the address of "3F" and all the memory cells positioned on the straight line connecting the memory cell at the address of "00" and the memory cell at the address of "1F" are marked with the circle. The memory cells having the circled address are the memory cells whose address is represented by the specified combination of the physical column addresses and the physical row addresses. Through the utilization of the logical sum of a flag signal FLG outputted from the circuit 22A shown in FIG. 5 and a flag signal FLG outputted from the circuit 22B shown in FIG. 8, it is possible to easily obtain a new flag signal which becomes "H" only when the memory cells having the circled address shown in FIG. 10 are accessed. Thus, through the use of the flag signal generation circuit 22 of the data logic forcefully controlling circuit formed by combining both logical circuits shown in FIGS. 5 and 8, it is possible to obtain a fail bit map with which the placement orientation of the memory macro 10 can be checked.

Figure 11:
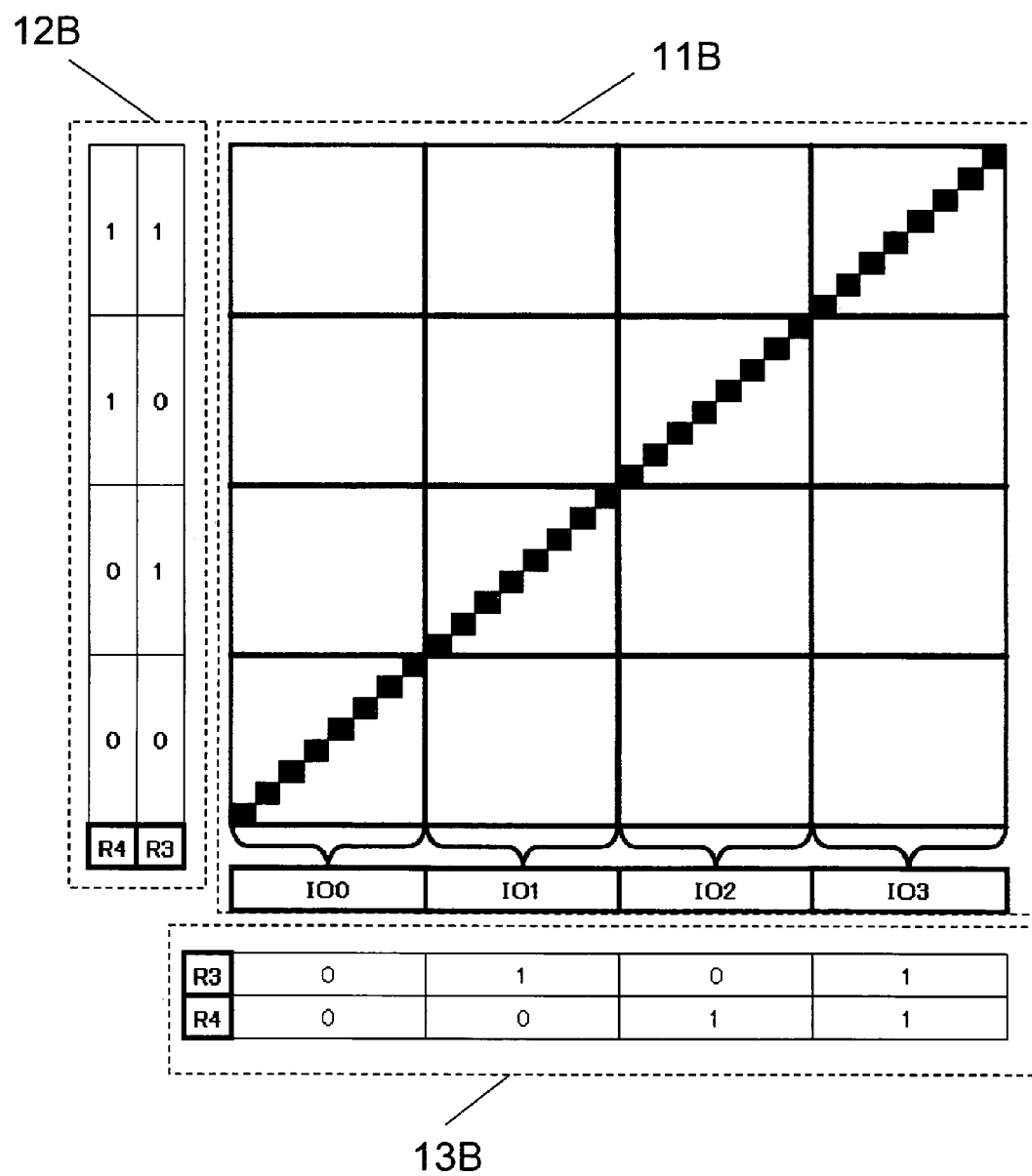
FIG. 11 is a fourth explanatory drawing of part 11B of the memory array 11, part 12B of the row decoder 12, and part 13B of the column decoder 13 which are included in the memory macro 10 shown in FIG. 1.

FIG. 11 is a fourth diagram showing part 11B of the memory array 11, part 12B of the row decoder 12, and part 13B of the column decoder 13 which are included in the memory macro 10 shown in FIG. 1. FIG. 11 differs from FIGS. 4, 7, 10 as to the following: a memory space corresponding to one specified data input and output port is indicated in FIGS. 4, 7, and 10, whereas a memory space corresponding to a plurality of data input and output ports is indicated in FIG. 11. In the fourth diagram, the memory space corresponding to the four data input and output ports IO0, IO1, IO2, and IO3 is indicated. Since the memory space corresponding to one of the four data input and output ports consists of 32 rows and 8 columns and there are memory cells the number of the four data input and output ports, the total of 1024 bits of memory space is indicated. In the memory array region 11B, the total of 32 memory cells on a diagonal line connecting the lower-left memory cell and the upper-right memory cell are filled in with black. When these memory cells are accessed, they are forced to fail. By utilizing higher-order physical row addresses R3 and R4 to obtain selecting signals for the data input and output ports, a continuous diagonal pattern is formed over the entire memory space. Although a logic circuit diagram and a logic chart related to the fourth diagram are not made particularly, it is possible to easily form the continuous diagonal pattern through the addition of conditions for the logical combinations of the higher-order physical row addresses R3 and R4 to the logical circuit shown in FIG. 5 and through the generation of flag signals FLG0, FLG1, FLG2, and FLG3 corresponding to the individual data input and output ports. Therefore, by detecting part of the row address signals to select the data input and output ports to be controlled, it becomes possible to make a distinction between the memory cells whose row address and column address are the same according to the differences between the data input and output ports, by which the memory cells at the specified addresses in the specified data input and output ports can be forced to fail.

Figure 12:
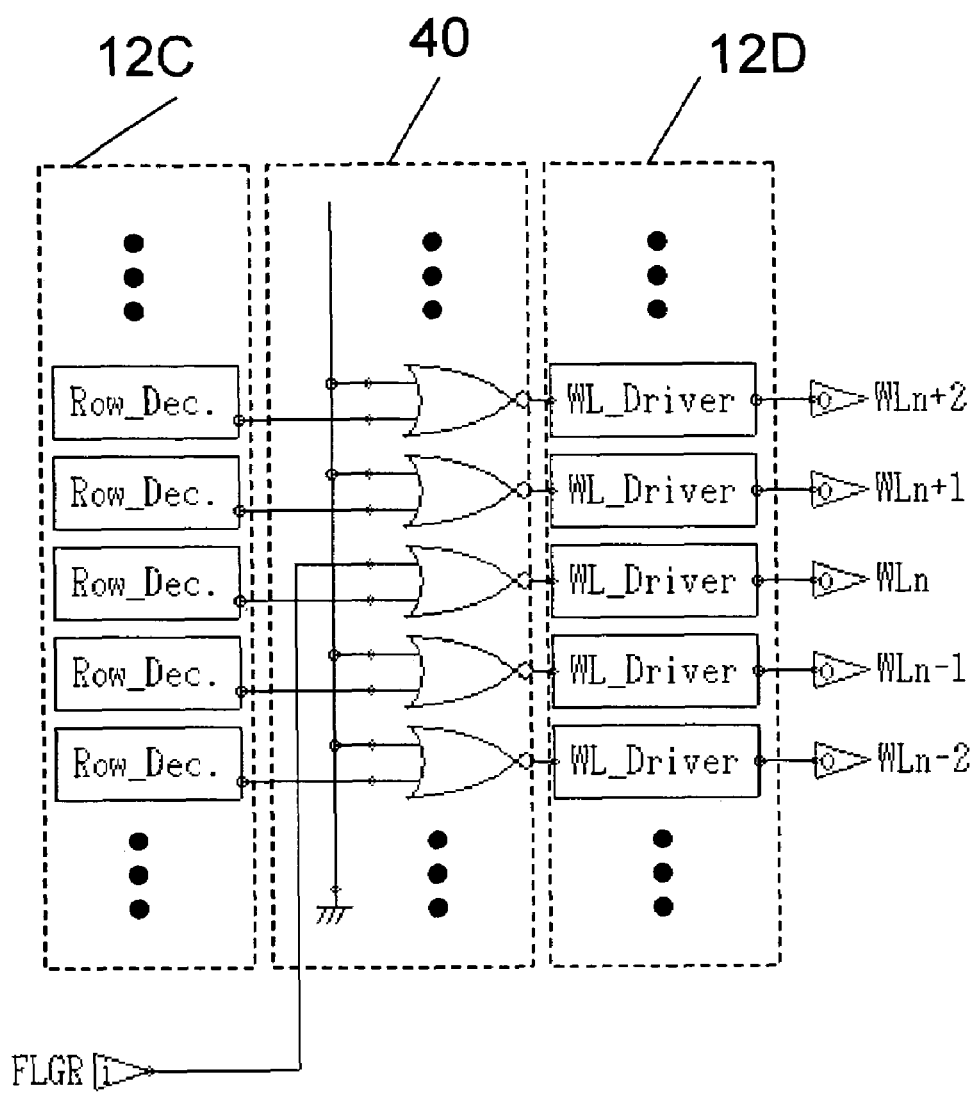
FIG. 12 is a diagram of a circuit configuration of the row decoder 12 and a specified row forcefully controlling circuit 40.

FIG. 12 is a diagram showing the circuit configuration of the row decoder 12 and the specified row forcefully controlling circuit 40.

The row decoder 12 is composed of a decode signal generation unit 12C and a word driver section 12D. The specified row forcefully controlling circuit 40 is positioned between the decode signal generation unit 12C and the word driver section 12D. A specified row forcefully controlling signal FLGR is a signal for controlling the word drivers connected to word lines WLn. The specified row forcefully controlling signal becomes "H" during forced fail operation, so that even when the word lines WLn are selected by the row decoder, they are not activated. The specified row forcefully controlling signal FLGR is "L" during normal operation, so that when the word lines WLn are selected by the row decoder, they are activated. Therefore, by deactivating the word lines selected according to the specified row addresses, the memory cells at the specified row addresses can be forced to fail.

Figure 13:
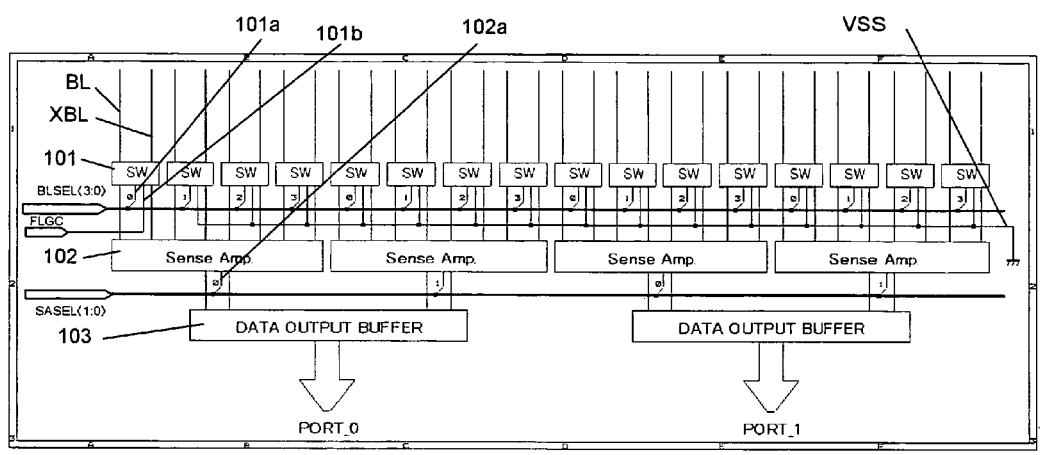
FIG. 13 is a circuit block diagram of a first specified column forcefully controlling unit.
Figure 14:
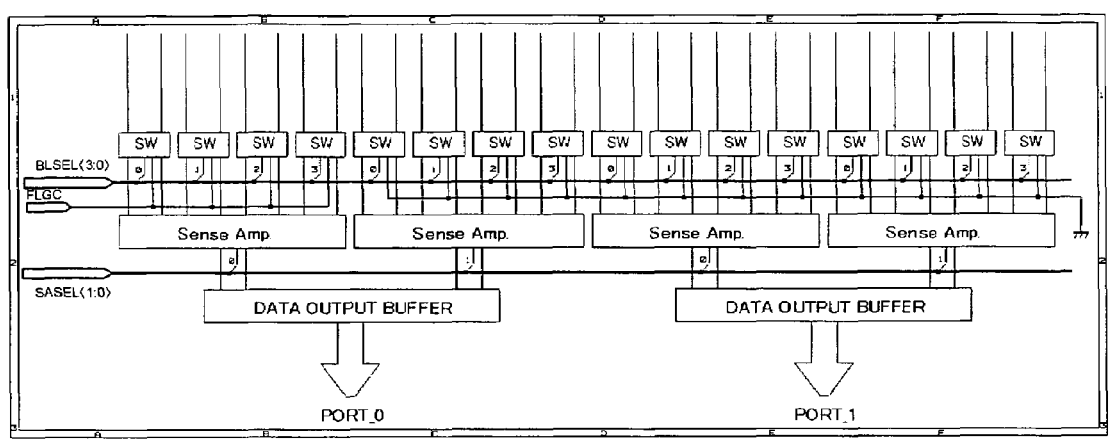
FIG. 14 is a circuit block diagram of a second specified column forcefully controlling unit.
Figure 15:
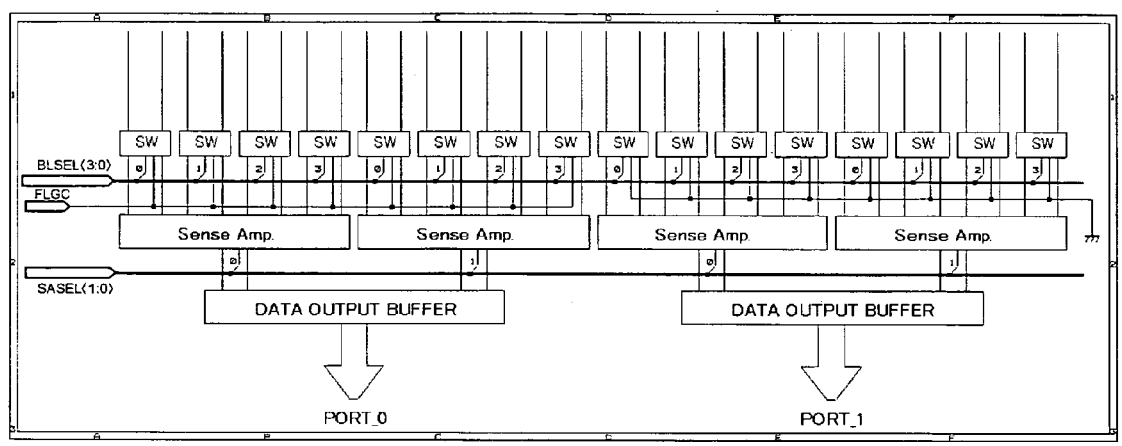
FIG. 15 is a circuit block diagram of a third specified column forcefully controlling unit.

FIGS. 13, 14, and 15 are circuit block diagrams of specified row forcefully controlling units. Bit lines BL and relative bit lines XBL are connected to sense amplifiers 102 via bit line connecting switches 101 for input. The output ends of the sense amplifiers 102 are connected to data output ports 103. The bit line connecting switch 101 has a bit line selection terminal 101a and an operation mode terminal 101b. The sense amplifier 102 has a sense amplifier selection terminal 102a. A bit line selection bus signal BLSEL<3:0> is distributed to the bit line selection terminals 101a and a sense amplifier selection bus signal SASEL<1:0> is distributed to the sense amplifier selection terminals 102a. A specified column forcefully controlling signal FLGC is send to specified some of the operation mode terminals 101b. The other operation mode terminals 101b are connected to a grounding terminal VSS. The specified column forcefully controlling signal FLGC becomes "H" during forced fail operation, so that the bit line connecting switches 101 remain "OFF" even when selected with the bit line selection bus signal BLSEL<3:0>. The specified column forcefully controlling signal FLGC becomes "L" during normal operation, so that the bit line connecting switches 101 are turned "ON" when selected with the bit line selection bus signal BLSEL<3:0>. That is, the memory cells, which belong to the columns to which the specified column forcefully controlling signal FLGC is inputted, fail during forced fail operation.

FIG. 13 is the circuit block diagram of the first specified column forcefully controlling unit. The specified column forcefully controlling signal FLGC is sent to only the operation mode terminal 101b of the leftmost bit line connecting switch 101. The operation mode terminals 101b of the other bit line connecting switches 101 are connected to the grounding terminal VSS. Thus the memory cells at the specified column addresses can be forced to fail by deactivating the bit line connecting switches 101 selected according to the specified column addresses.

FIG. 14 is the circuit block diagram of the second specified column forcefully controlling unit. The specified column forcefully controlling signal FLGC is sent to the operation mode terminals 101b of the bit line connecting switches 101 connected to the leftmost sense amplifier 102. The operation mode terminals 101b of the bit line connecting switches 101 connected to the other sense amplifiers 102 are connected to the grounding terminal VSS. Furthermore, as another means, an operation mode terminal may be provided to the individual sense amplifiers 102 to send the specified column forcefully controlling signal FLGC to the operation mode terminals of the specified sense amplifier. In this case, there is no need to provide the operation mode terminals to the bit line connecting switches 101. Therefore all the memory cells connected to the sense amplifiers 102 selected according to the specified column addresses can be forced to fail by deactivating all the bit line connecting switches 101 connected to the sense amplifiers 102 selected according to the specified column addresses or by deactivating the sense amplifiers 102 selected according to the specified column addresses.

FIG. 15 is the circuit block diagram of the third specified column forcefully controlling unit. The specified column forcefully controlling signal FLGC is sent to the operation mode terminals 101b of the bit line connecting switches 101 connected to the leftmost and the next sense amplifiers 102. The operation mode terminals 101b of the bit line connecting switches 101 connected to the other sense amplifiers 102 are connected to the grounding terminal VSS. Furthermore, as another means, an operation mode terminal may be provided to the individual data output ports to send the specified column forcefully controlling signal FLGC to the operation mode terminal of the specified data output port. In this case, there is no need to provide the operation mode terminals to the bit line connecting switches and the sense amplifiers. Therefore, all the memory cells corresponding to the specified data output port can be forced to fail by deactivating all the bit lines connecting switches 101 corresponding to the specified data output port or by deactivating the specified data output port.

Although the description about the control of the circuit of a data reading system has been made with reference to FIGS. 13, 14, and 15, a circuit of a data writing system may be controlled as another means.

Figure 16:
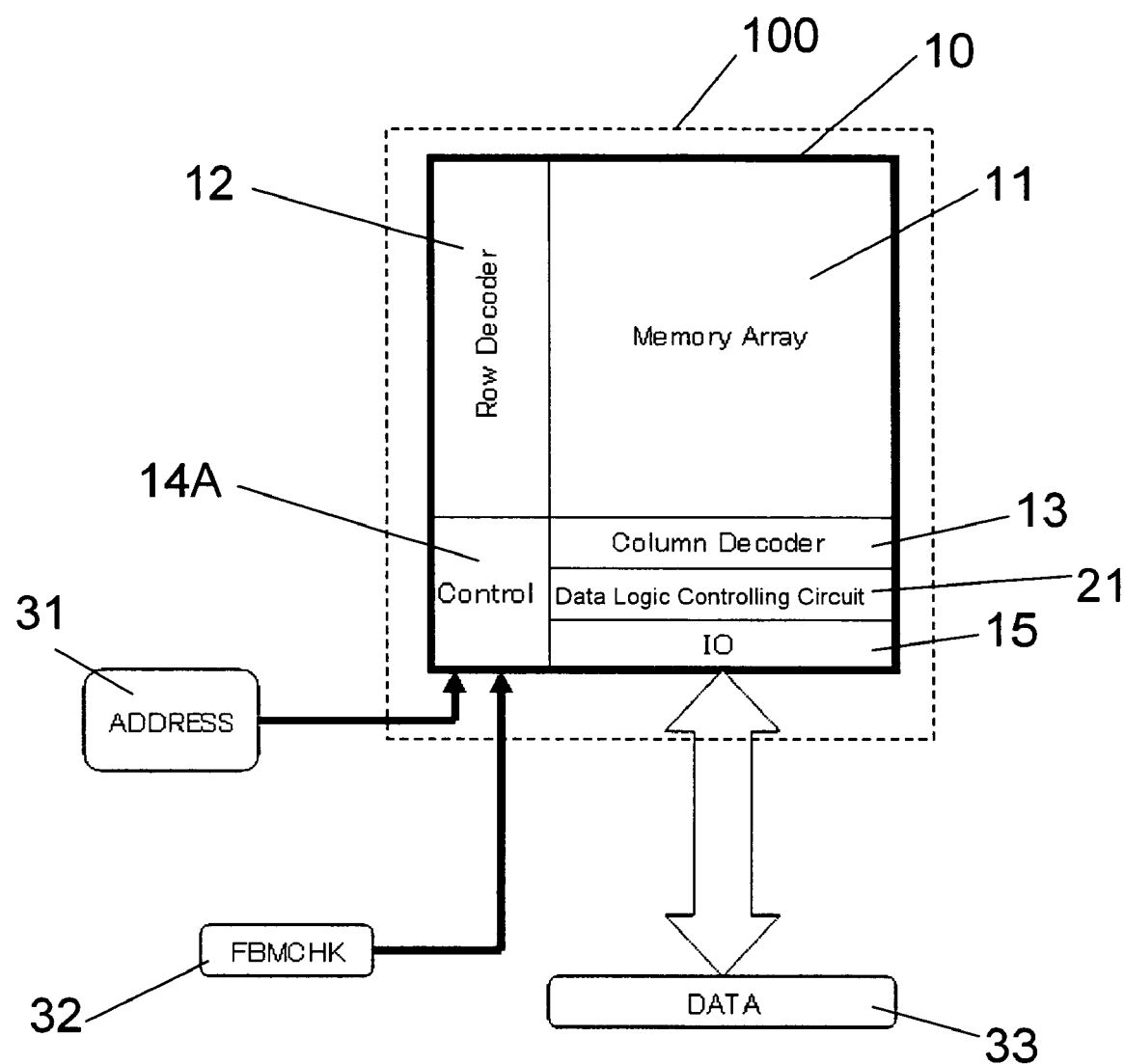
FIG. 16 is a block diagram showing an example of a configuration of a semiconductor memory device according to a second embodiment of the invention.

FIG. 16 is a block diagram of an example of a configuration of a semiconductor memory device according to a second embodiment of the invention. The configuration shown in FIG. 16 differs from that shown in FIG. 1 in that the data logic forcefully controlling circuit 21 is included in the memory macro 10. Although not shown in FIG. 16, the specified row forcefully controlling unit 40 and the specified column forcefully controlling unit 50 are also included in the memory macro 10. And furthermore, the flag signal generation circuit 22 of the data logic forcefully controlling circuit 21 and the address scramble block 30 are included in a control unit 14A. Therefore, since the forcefully controlling units such as the data logic forcefully controlling unit, the specified row forcedly controlling unit, and the specified column forcefully controlling unit are included in the memory macro 10 having the components required for normal operation, the memory cells at the specified address can be forced to fail by providing only the memory macro 10 without the particular consideration of the placement of such forcefully controlling units.

Figure 17:
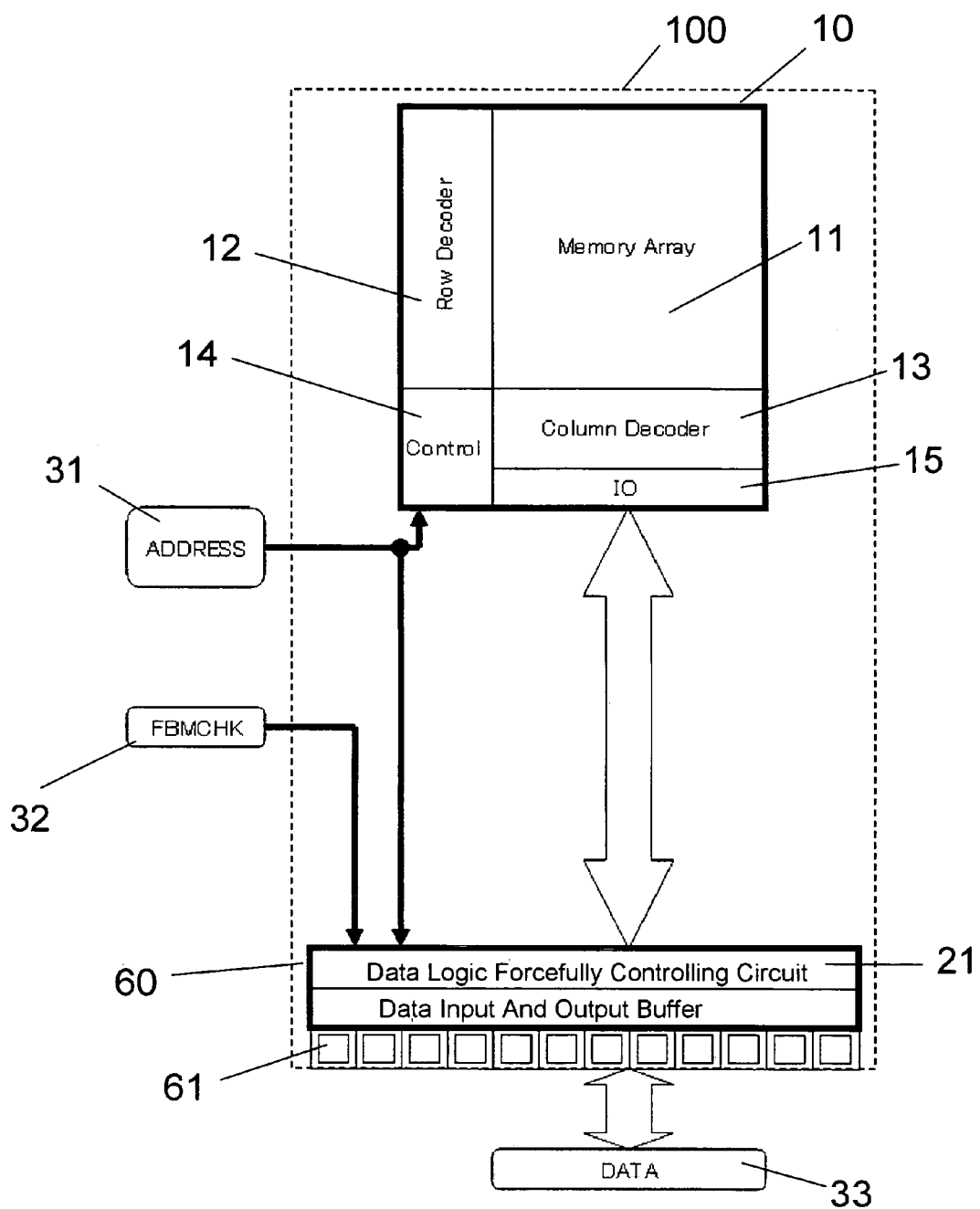
FIG. 17 is a block diagram showing an example of a configuration of a semiconductor memory device according to a third embodiment of the invention.

FIG. 17 is a block diagram of an example of a configuration of a semiconductor memory device according to a third embodiment of the invention. FIG. 17 differs from FIG. 1 or FIG. 16 in that the data logic forcefully controlling unit is included in a data input and output buffer cell block 60. The data input and output buffer cell block 60 is positioned at the end of the semiconductor memory chip and is placed immediately near data input and output pads 61. Like this, since the data logic forcefully controlling unit is included in the data input and output buffer cell block 60 of the semiconductor memory device, the memory cells at the specified addresses can be forced to fail by providing only the data input and output buffer cell block without the particular consideration of the placement of the data logic forcefully controlling unit.

Figure 18:
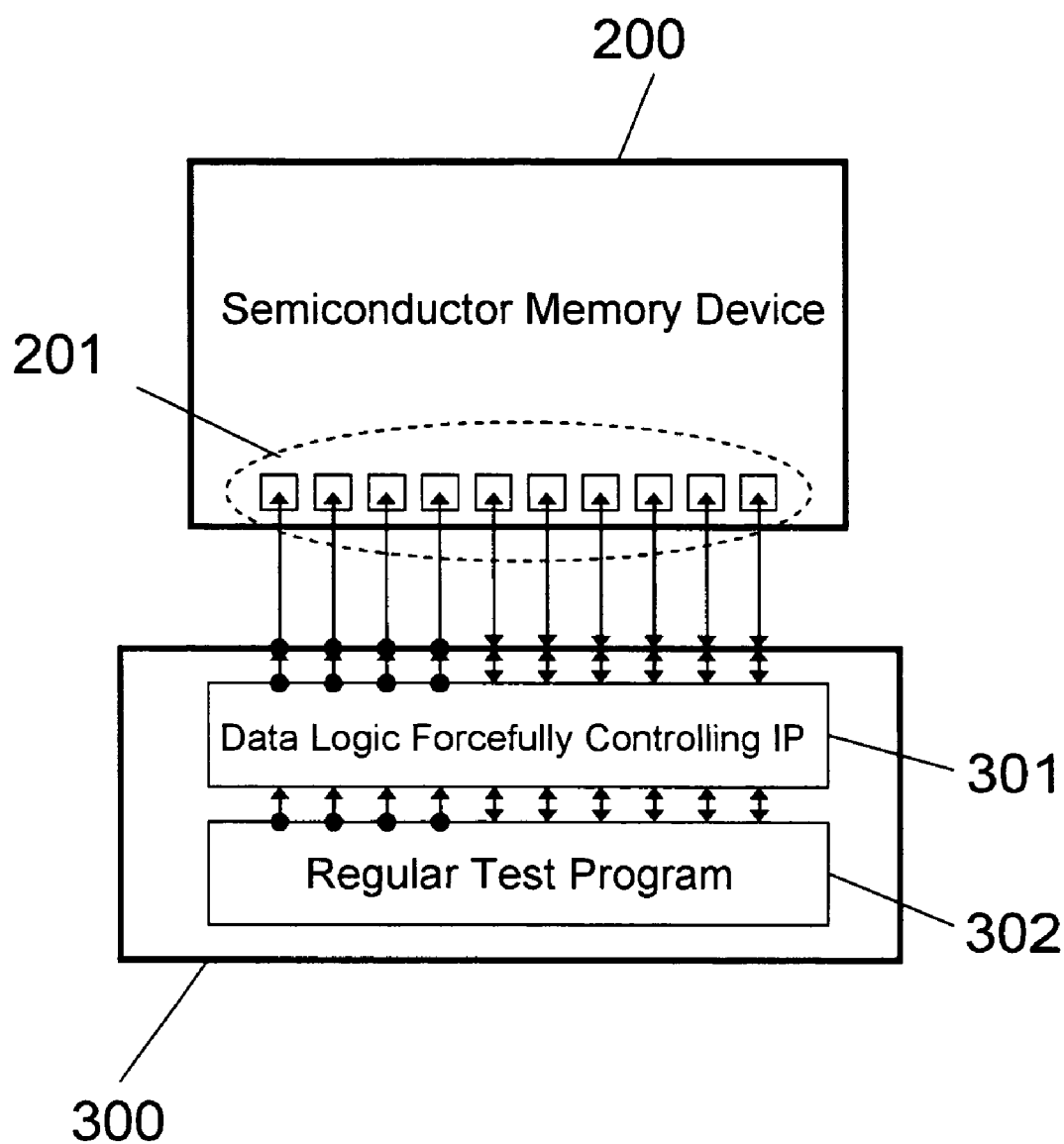
FIG. 18 is an explanatory drawing of a method for testing the semiconductor memory device.

FIG. 18 is an explanatory drawing of a method for testing a semiconductor memory device. A semiconductor memory device 200 does not include the data logic forcefully controlling circuit but has a plurality of signal terminals 201. A semiconductor memory testing device 300 is connected to the signal terminal 201 and has a data logic forcefully controlling IP 301 and a regular test program 302. The data logic forcefully controlling IP 301 is a soft IP and is not complexly included in the regular test program 302; that is, has an independent function and is provided or supplied aside from the regular test program 302. Input and output signals of the semiconductor memory device 200 are controlled by using the normal operation test program 302 through the medium of the data logic forcefully controlling IP 301. Like this, since the data logic forcefully controlling IP is the soft IP having the independent function, controls the various signals between the semiconductor memory device and the semiconductor memory testing device, and is controlled by the signals therebetween, the memory cells at the specified addresses can be force to fail without the placement of the data logic forcefully controlling unit onto the semiconductor memory device and without the particular modification of the regular test program 302.

FIGS. 19 through 27 are diagrams showing fail bit map check patterns which can be formed by using the various units described with reference to FIGS. 1 through 18.

Figure 19:
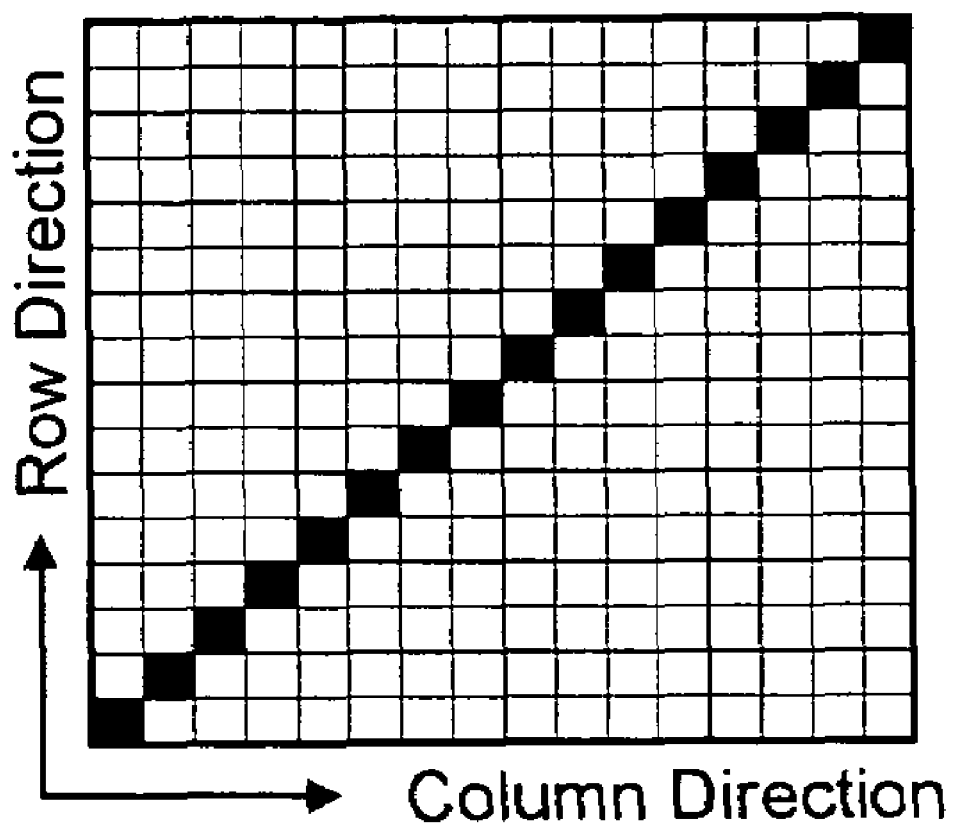
FIG. 19 is a fail bit map check diagram showing a diagonal pattern.

FIG. 19 is a fail bit map check diagram showing a diagonal pattern described with reference to FIG. 4 or 11.

Figure 20:
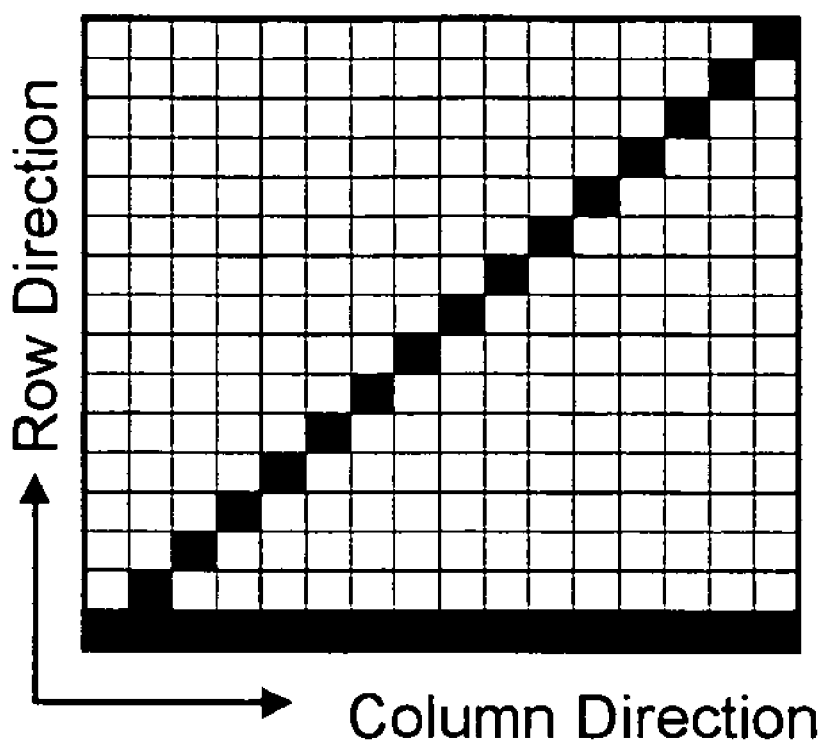
FIG. 20 is a fail bit map check diagram showing a pattern made of both the diagonal pattern shown in FIG. 19 and a straight pattern represented by memory cells at a physical row address of "0"

FIG. 20 is a fail bit map check diagram showing a pattern formed by both the diagonal pattern shown in FIG. 19 and a straight pattern represented by the memory cells at the physical row address of "0". The pattern shown in FIG. 20 can be formed by using the data logic forcefully controlling unit and the specified row forcedly controlling unit.

Figure 21:
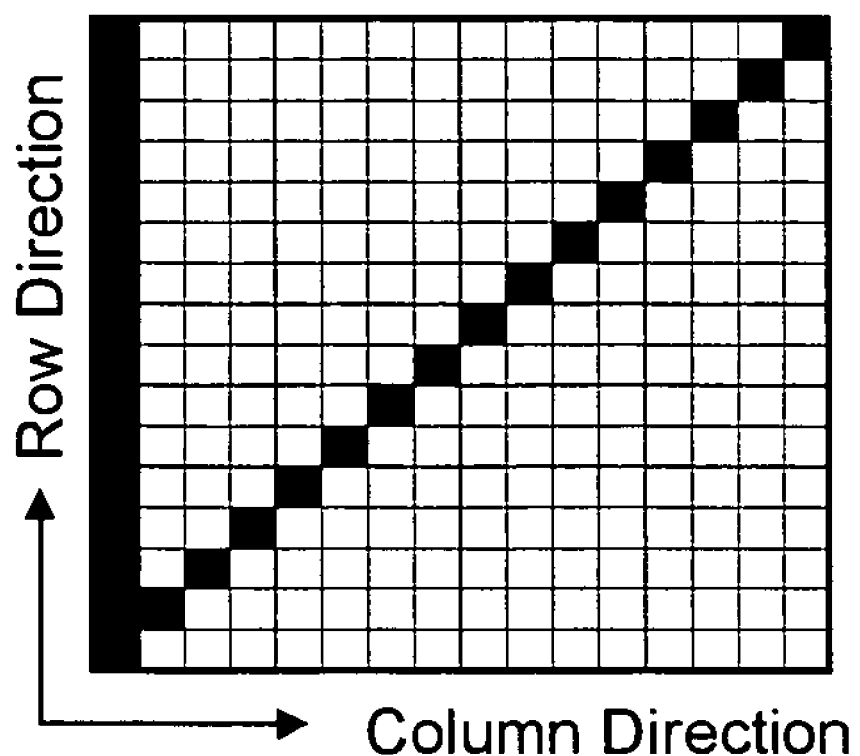
FIG. 21 is a fail bit map check diagram showing a pattern made of both the diagonal pattern shown in FIG. 19 and a straight pattern represented by memory cells at a physical column address of "0"

FIG. 21 is a fail bit map check diagram showing a pattern formed by both the diagonal pattern shown in FIG. 19 and a straight pattern represented by the memory cells at the physical column address of "0". The pattern shown in FIG. 21 can be formed by using the data logic forcefully controlling unit and the specified column forcefully controlling unit.

Figure 22:
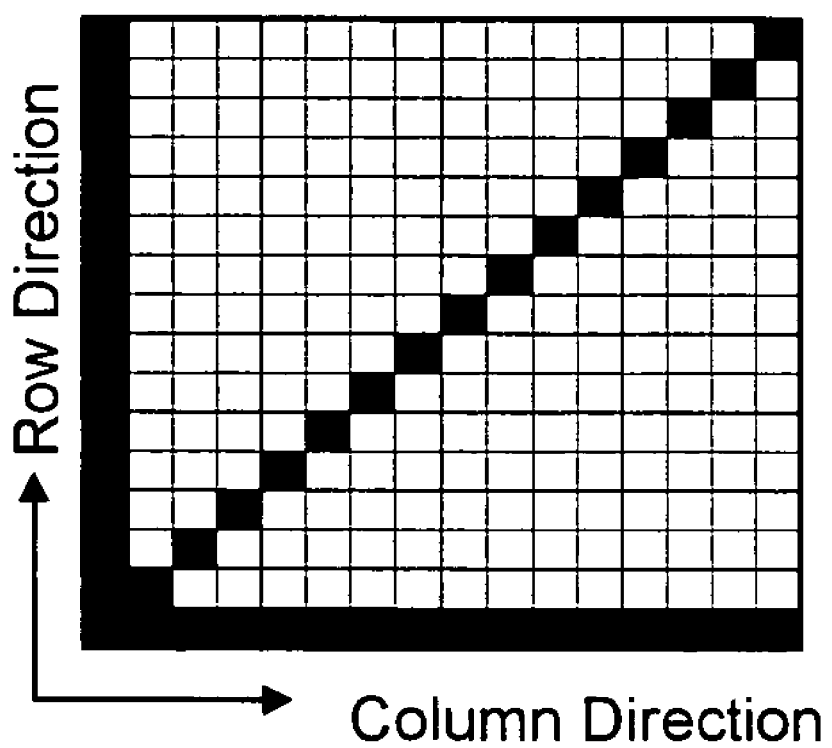
FIG. 22 is a fail bit map check diagram showing a pattern made of the diagonal pattern shown in FIG. 19, of the straight pattern represented by the memory cells at the physical row address of "0", and of the straight pattern represented by the memory cells at the physical column address of "0"

FIG. 22 is a fail bit map check diagram showing a pattern made by the diagonal pattern shown in FIG. 19, the straight pattern represented by the memory cells at the physical row address of "0", and the straight pattern represented by the memory cells at the physical column address of "0". The pattern shown in FIG. 22 can be formed by using the data logic forcefully controlling unit, the specified row forcefully controlling unit, and the specified column forcefully controlling unit.

Figure 23:
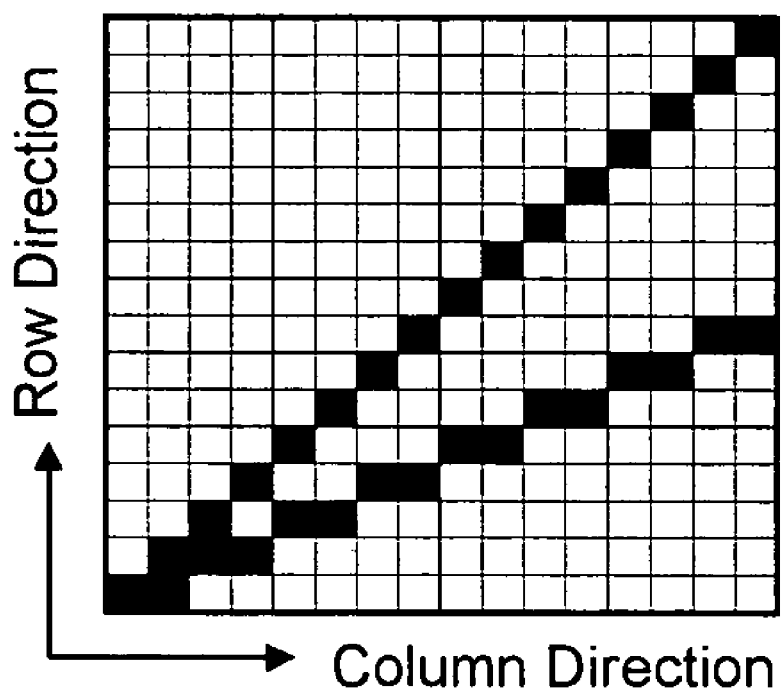
FIG. 23 is a fail bit map check diagram showing a pattern made of two oblique straight patterns.

FIG. 23 is a fail bit map check diagram showing the pattern made by the two oblique lines shown in FIG. 10. The pattern shown in FIG. 23 can be formed by using the data logic forcefully controlling unit.

Figure 24:
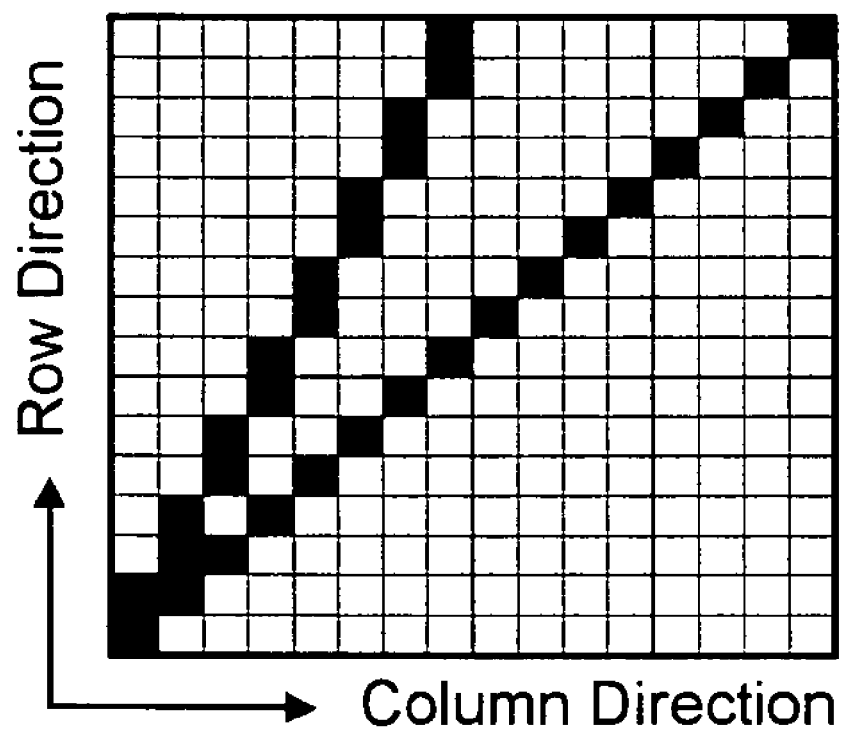
FIG. 24 is a fail bit map check diagram showing a pattern made of two oblique straight patterns which are formed by transposing the rows and columns of the pattern shown in FIG. 23.

FIG. 24 is a fail bit map check diagram showing a pattern made by two oblique straight patterns which are formed by transposing the rows and columns of the pattern shown in FIG. 23. The pattern shown in FIG. 24 can be formed by using the data logic forcefully controlling unit.

Figure 25:
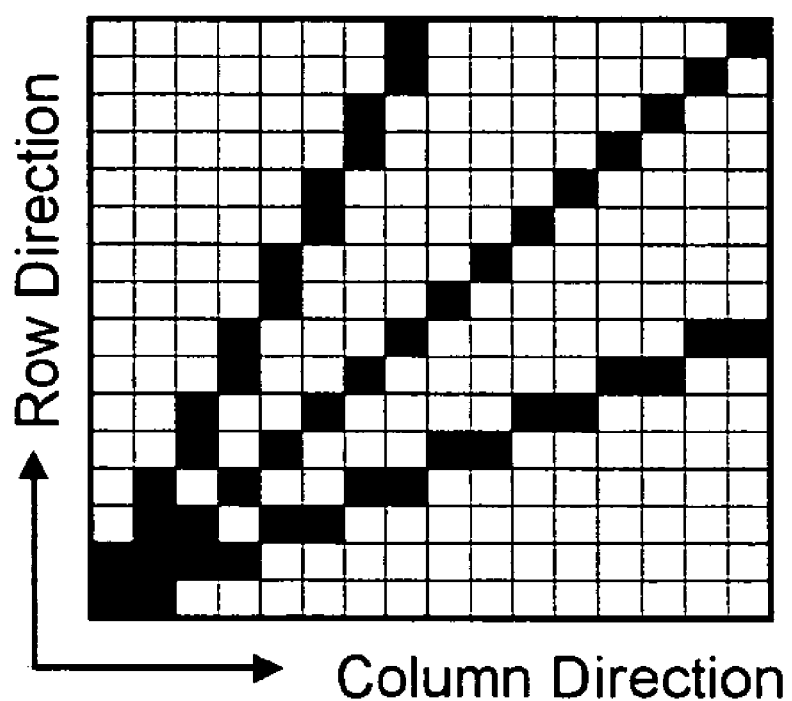
FIG. 25 is a fail bit map check diagram showing a pattern made by superposing the pattern shown in FIG. 23 on the pattern shown in FIG. 24.

FIG. 25 is a fail bit map checking diagram showing a pattern made by superposing the pattern shown in FIG. 23 on the pattern shown in FIG. 24. The pattern shown in FIG. 25 can be formed by using the data logic forcefully controlling unit.

Figure 26:
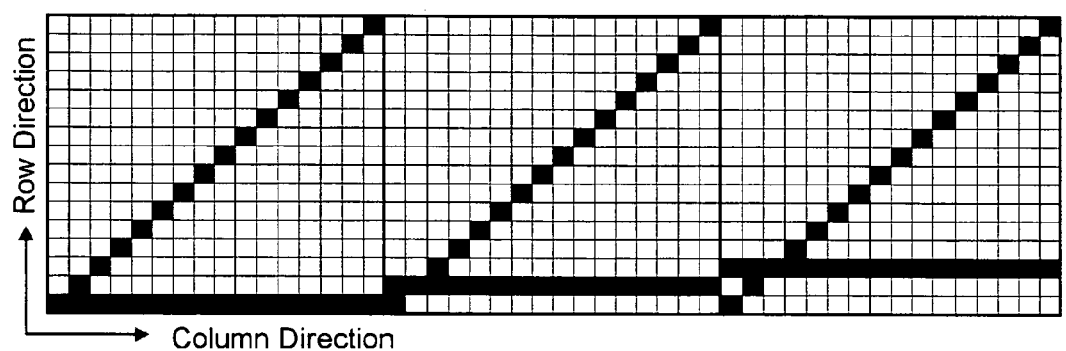
FIG. 26 is a fail bit map check drawing showing a pattern in which the consecutive memory cells in column directions are higher than the consecutive memory cells in row directions in number.

FIG. 26 is a fail bit map check diagram showing a case where consecutive memory cells in the column direction are higher than those in the row direction in number. In FIG. 26, when the consecutive memory cells in the column direction becomes equal to those in the row direction in number, the straight pattern in the column direction shifts to the next upper row. The pattern shown in FIG. 26 can be formed by using the data logic forcefully controlling unit and the specified row forcefully controlling unit.

Figure 27:
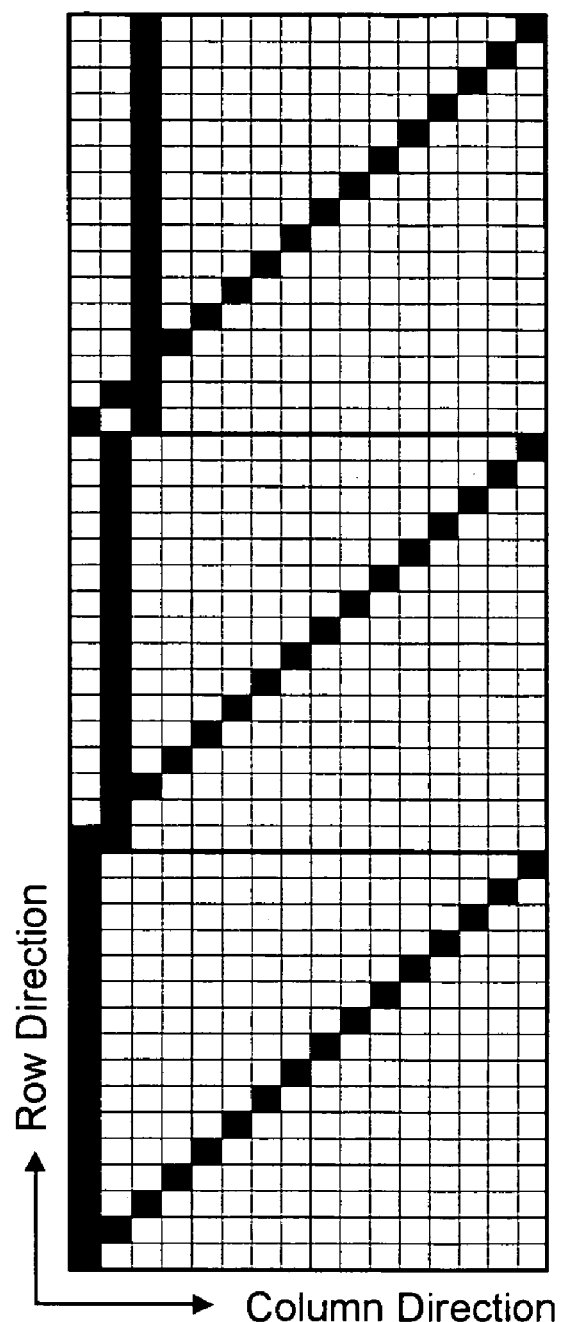
FIG. 27 is a fail bit map check diagram showing a pattern in which the consecutive memory cells in row directions are higher than the consecutive memory cells in column directions in number.
Figure 28:
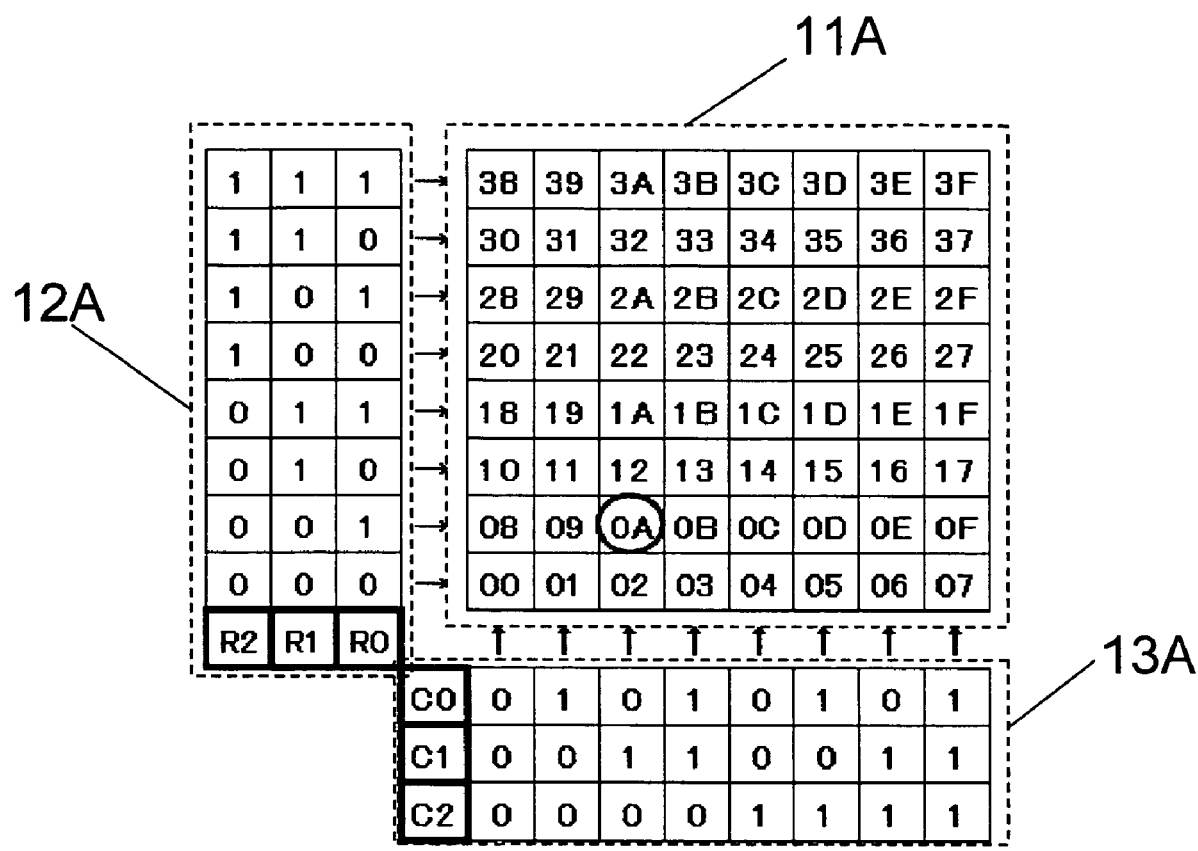
FIG. 28 is a drawing of part of a memory macro placed on an real semiconductor memory device.
Figure 29:
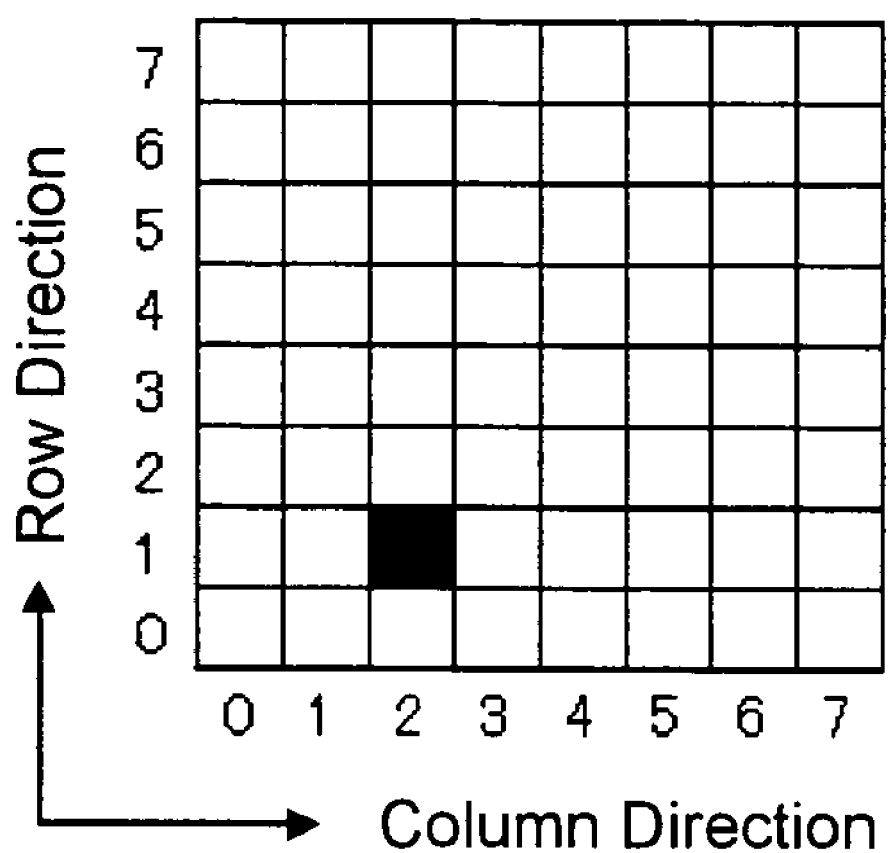
FIG. 29 is a fail bit map of the semiconductor memory device shown in FIG. 28.

FIG. 27 is a fail bit map check diagram showing a case where consecutive memory cells in the row direction are higher than those in the column direction in number. In FIG. 27, when the consecutive memory cells in the row direction becomes equal to those in the column direction in number, the straight pattern in the row direction shifts to the next rightward column. The pattern shown in FIG. 27 can be formed by using the data logic forcefully controlling unit and the specified column forcefully controlling unit.

Although the examples of the fail bit map check patterns have been cited with reference to FIGS. 19 to 27, the intention of the invention is not limited to those shown in FIGS. 19 to 27. That is, the intention of the intention is to have a unit which outputs a pattern, which performs a function of checking a fail bit map of a semiconductor memory device, namely, a function capable of surely checking that the arrangement of memory cells on a real semiconductor memory device and the arrangement of memory cells on the fail bit map are the same, on the fail bit map.

The semiconductor memory device according to the invention has the function of forcing the specified memory cells to fail, requires no working such as the intentional making of the failure bits using FIB, has the effect of enabling the instantaneous checking of the fail bit map over the entire address space, and is useful as a semiconductor memory device capable of obtaining a fail bit map and a method for testing the same.

What is claimed is:

1. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a data logic forcefully controlling unit, the data logic forcefully controlling unit forcefully controlling the logic of the write data into the memory cells selected by using a specified address signal or of the read data, wherein:
the data logic forcefully controlling unit is included in a data input and output buffer cell block.

2. A method for testing a semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a data logic forcefully controlling unit, the data logic forcefully controlling unit forcefully controlling the logic of the write data into the memory cells selected by using a specified address signal or of the read data,
the method involving the use of the data logic forcefully controlling unit which forcefully controls the logic of the write data into the memory cells selected by using the specified address signal or of the read data, is a soft IP having an independent function, and is controlled by using various signals between the semiconductor memory device and the semiconductor memory testing device.

3. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a data logic forcefully controlling unit, the data logic forcefully controlling unit forcefully controlling the logic of the write data into the memory cells selected by using a specified address signal or of the read data, wherein:

the forcefully controlling unit is included in a memory macro including components required for normal operation.

4. A semiconductor memory device comprising:

a memory cell array composed of a plurality of memory cells whose addresses are represented by a plurality of row addresses and a plurality of column addresses;

a row selecting unit which selects the memory cells at the specified rows from among the memory cells;

a column selecting unit which selects the memory cells at the specified columns from among the memory cells;

a data writing unit which writes data into the specified memory cells selected by the row selecting unit and the column selecting unit;

a data reading unit which reads the data from the specified memory cells; and a specified row forcefully controlling unit, the specified row forcefully controlling unit forcefully making the control of the memory cells selected by using a specified row address signal to the control exercised during operation different from normal operation, wherein:

the forcefully controlling unit is included in a memory macro including components required for normal operation.

5. A semiconductor memory device comprising:

a memory cell array composed of a plurality of memory cells whose addresses are represented by a plurality of row addresses and a plurality of column addresses;

a row selecting unit which selects the memory cells at the specified rows from among the memory cells;

a column selecting unit which selects the memory cells at the specified columns from among the memory cells;

a data writing unit which writes data into the specified memory cells selected by the row selecting unit and the column selecting unit;

a data reading unit which reads the data from the specified memory cells; and a specified column forcefully controlling unit, the specified column forcefully controlling unit forcefully making the control of the memory cells selected by using a specified column address signal to the control exercised during operation different from normal operation, wherein:

the forcefully controlling unit is included in a memory macro including components required for normal operation.

6. A semiconductor memory device comprising:

a memory cell array composed of a plurality of memory cells whose addresses are represented by a plurality of row addresses and a plurality of column addresses;

a row selecting unit which selects the memory cells at the specified rows from among the memory cells;

a column selecting unit which selects the memory cells at the specified columns from among the memory cells;

a data writing unit which writes data into the specified memory cells selected by the row selecting unit and the column selecting unit;

a data reading unit which reads the data from the specified memory cells;

a data logic forcefully controlling unit, the data logic forcefully controlling unit forcefully controlling the logic of the write data into the memory cells selected by using a specified address signal or of the read data; and an address scramble circuit which converts a logical address signal inputted from the outside to a physical address signal inputted to the various internal circuits including the row selecting unit and the column selecting unit.

7. A semiconductor memory device comprising:

a memory cell array composed of a plurality of memory cells whose addresses are represented by a plurality of row addresses and a plurality of column addresses;

a row selecting unit which selects the memory cells at the specified rows from among the memory cells;

a column selecting unit which selects the memory cells at the specified columns from among the memory cells;

a data writing unit which writes data into the specified memory cells selected by the row selecting unit and the column selecting unit;

a data reading unit which reads the data from the specified memory cells;

a specified row forcefully controlling unit, the specified row forcefully controlling unit forcefully making the control of the memory cells selected by using a specified row address signal to the control exercised during operation different from normal operation; and an address scramble circuit which converts a logical address signal inputted from the outside to a physical address signal inputted to the various internal circuits including the row selecting unit and the column selecting unit.

8. A semiconductor memory device comprising:

a memory cell array composed of a plurality of memory cells whose addresses are represented by a plurality of row addresses and a plurality of column addresses;

a row selecting unit which selects the memory cells at the specified rows from among the memory cells;

a column selecting unit which selects the memory cells at the specified columns from among the memory cells;

a data writing unit which writes data into the specified memory cells selected by the row selecting unit and the column selecting unit;

a data reading unit which reads the data from the specified memory cells; and a specified column forcefully controlling unit, the specified column forcefully controlling unit forcefully making the control of the memory cells selected by using a specified column address signal to the control exercised during operation different from normal operation; and an address scramble circuit which converts a logical address signal inputted from the outside to a physical address signal inputted to the various internal circuits including the row selecting unit and the column selecting unit.

9. A semiconductor memory device comprising:

a memory cell array composed of a plurality of memory cells whose addresses are represented by a plurality of row addresses and a plurality of column addresses;

a row selecting unit which selects the memory cells at the specified rows from among the memory cells;

a column selecting unit which selects the memory cells at the specified columns from among the memory cells;

a data writing unit which writes data into the specified memory cells selected by the row selecting unit and the column selecting unit;

a data reading unit which reads the data from the specified memory cells; and a data logic forcefully controlling unit, the data logic forcefully controlling unit forcefully controlling the logic of the write data into the memory cells selected by using a specified address signal or of the read data, wherein:

the data logic forcefully controlling unit reverses the logic of at least the 1 specified bits of write or read data.

10. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a data logic forcefully controlling unit, the data logic forcefully controlling unit forcefully controlling the logic of the write data into the memory cells selected by using a specified address signal or of the read data, wherein:
the data logic forcefully controlling unit forcefully fixes the logic of at least the 1 specified bits of write or read data to a "L" or "H" state.

11. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified row forcefully controlling unit, the specified row forcefully controlling unit forcefully making the control of the memory cells selected by using a specified row address signal to the control exercised during operation different from normal operation, wherein:
the specified row forcefully controlling unit deactivates word lines selected according to the specified row addresses.

12. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified column forcefully controlling unit, the specified column forcefully controlling unit forcefully making the control of the memory cells selected by using a specified column address signal to the control exercised during operation different from normal operation, wherein:
the specified column forcefully controlling unit deactivates bit line selecting switches selected according to the specified column addresses.

13. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified column forcefully controlling unit, the specified column forcefully controlling unit forcefully making the control of the memory cells selected by using a specified column address signal to the control exercised during operation different from normal operation, wherein:
the specified column forcefully controlling unit deactivates sense amplifiers selected according to the specified column addresses.

14. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified column forcefully controlling unit, the specified column forcefully controlling unit forcefully making the control of the memory cells selected by using a specified column address signal to the control exercised during operation different from normal operation, wherein:
the specified column forcefully controlling unit deactivates specified data input and output ports.

15. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a data logic forcefully controlling unit, the data logic forcefully controlling unit forcefully controlling the logic of the write data into the memory cells selected by using a specified address signal or of the read data, wherein:
the forcefully controlling unit is controlled through the medium of an operation mode terminal specifically provided to set the semiconductor memory device.

16. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified row forcefully controlling unit, the specified row forcefully controlling unit forcefully making the control of the memory cells selected by using a specified row address signal to the control exercised during operation different from normal operation, wherein:
the forcefully controlling unit is controlled through the medium of an operation mode terminal specifically provided to set the semiconductor memory device.

17. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified column forcefully controlling unit, the specified column forcefully controlling unit forcefully making the control of the memory cells selected by using a specified column address signal to the control exercised during operation different from normal operation, wherein:
the forcefully controlling unit is controlled through the medium of an operation mode terminal specifically provided to set the semiconductor memory device.

18. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a data logic forcefully controlling unit, the data logic forcefully controlling unit forcefully controlling the logic of the write data into the memory cells selected by using a specified address signal or of the read data, wherein:
the forcefully controlling unit is controlled through the medium of a plurality of controlling terminals used in a normal operation mode brought by the semiconductor memory device.

19. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified row forcefully controlling unit, the specified row forcefully controlling unit forcefully making the control of the memory cells selected by using a specified row address signal to the control exercised during operation different from normal operation, wherein:
the forcefully controlling unit is controlled through the medium of a plurality of controlling terminals used in a normal operation mode brought by the semiconductor memory device.

20. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified column forcefully controlling unit, the specified column forcefully controlling unit forcefully making the control of the memory cells selected by using a specified column address signal to the control exercised during operation different from normal operation, wherein:
the forcefully controlling unit is controlled through the medium of a plurality of controlling terminals used in a normal operation mode brought by the semiconductor memory device.

21. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a data logic forcefully controlling unit, the data logic forcefully controlling unit forcefully controlling the logic of the write data into the memory cells selected by using a specified address signal or of the read data, wherein:
the data logic forcefully controlling unit detects the complete correspondence of column address signals and row address signals to control the logic of the write or read data.

22. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a data logic forcefully controlling unit, the data logic forcefully controlling unit forcefully controlling the logic of the write data into the memory cells selected by using a specified address signal or of the read data, wherein:
the data logic forcefully controlling unit detects the partial correspondence of the column address signals and the row address signals to control the logic of the write or read data.

23. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a data logic forcefully controlling unit, the data logic forcefully controlling unit forcefully controlling the logic of the write data into the memory cells selected by using a specified address signal or of the read data, wherein:
the data logic forcefully controlling unit detects part of the row address signal to select data input and output ports which control the logic of the write or read data.

24. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a data logic forcefully controlling unit, the data logic forcefully controlling unit forcefully controlling the logic of the write data into the memory cells selected by using a specified address signal or of the read data, wherein:
the forcefully controlling unit has a forced fail unit which forces the memory cells whose addresses are represented by all the rows and the specific columns to fail and which forces the memory cells whose addresses are represented by all the columns and the specific rows to fail.

25. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified row forcefully controlling unit, the specified row forcefully controlling unit forcefully making the control of the memory cells selected by using a specified row address signal to the control exercised during operation different from normal operation, wherein:
the forcefully controlling unit has a forced tail unit which forces the memory cells whose addresses are represented by all the rows and the specific columns to fail and which forces the memory cells whose addresses are represented by all the columns and the specific rows to fail.

26. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified column forcefully controlling unit, the specified column forcefully controlling unit forcefully making the control of the memory cells selected by using a specified column address signal to the control exercised during operation different from normal operation, wherein:
the forcefully controlling unit has a forced fail unit which forces the memory cells whose addresses are represented by all the rows and the specific columns to fail and which forces the memory cells whose addresses are represented by all the columns and the specific rows to fail.

27. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a data logic forcefully controlling unit, the data logic forcefully controlling unit forcefully controlling the logic of the write data into the memory cells selected by using a specified address signal or of the read data, wherein:

the forcefully controlling unit has the forced fail unit which forms a fail bit pattern characteristic of the placement direction of the memory macro which includes the memory cells.

28. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified row forcefully controlling unit, the specified row forcefully controlling unit forcefully making the control of the memory cells selected by using a specified row address signal to the control exercised during operation different from normal operation, wherein:
the forcefully controlling unit has the forced fail unit which forms a fail bit pattern characteristic of the placement direction of the memory macro which includes the memory cells.

29. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified column forcefully controlling unit, the specified column forcefully controlling unit forcefully making the control of the memory cells selected by using a specified column address signal to the control exercised during operation different from normal operation, wherein:
the forcefully controlling unit has the forced fail unit which forms a fail bit pattern characteristic of the placement direction of the memory macro which includes the memory cells.

30. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a data logic forcefully controlling unit, the data logic forcefully controlling unit forcefully controlling the logic of the write data into the memory cells selected by using a specified address signal or of the read data, wherein:
the forcefully controlling unit has the forced fail unit which forms the fail bit pattern with which address mapping and data input and output port mapping can be checked over the entire memory space even when the memory cells arranged in the row direction differ from the memory cells arranged in the column direction in number.

31. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified row forcefully controlling unit, the specified row forcefully controlling unit forcefully making the control of the memory cells selected by using a specified row address signal to the control exercised during operation different from normal operation, wherein:
the forcefully controlling unit has the forced fail unit which forms the fail bit pattern with which address mapping and data input and output port mapping can be checked over the entire memory space even when the memory cells arranged in the row direction differ from the memory cells arranged in the column direction in number.

32. A semiconductor memory device comprising:
a memory cell array composed of a plurality of memory cells whose addresses are represented by a plurality of row addresses and a plurality of column addresses;
a row selecting unit which selects the memory cells at the specified rows from among the memory cells;
a column selecting unit which selects the memory cells at the specified columns from among the memory cells;
a data writing unit which writes data into the specified memory cells selected by the row selecting unit and the column selecting unit;
a data reading unit which reads the data from the specified memory cells; and
a specified column forcefully controlling unit, the specified column forcefully controlling unit forcefully making the control of the memory cells selected by using a specified column address signal to the control exercised during operation different from normal operation, wherein:
the forcefully controlling unit has the forced fail unit which forms the fail bit pattern with which address mapping and data input and output port mapping can be checked over the entire memory space even when the memory cells arranged in the row direction differ from the memory cells arranged in the column direction in number.

* * * * *